(12) United States Patent
Day et al.

(10) Patent No.: US 6,195,625 B1
(45) Date of Patent: Feb. 27, 2001

(54) METHOD FOR SIMULATING COLLISIONS

(75) Inventors: Terry D. Day, Portland, OR (US); Allen R. York, Apex, NC (US)

(73) Assignee: Engineering Dynamics Corporation, Beaverton, OR (US)

(*) Notice: Subject to any disclaimer, the term of this patent is extended or adjusted under 35 U.S.C. 154(b) by 0 days.

(21) Appl. No.: 09/259,245

(22) Filed: Feb. 26, 1999

(51) Int. Cl.[7] .............................. G06F 17/50; G06G 7/48
(52) U.S. Cl. ........................................ 703/7; 703/1; 703/8
(58) Field of Search ........................................ 703/7–8, 1

(56) References Cited

U.S. PATENT DOCUMENTS

| | | | |
|---|---|---|---|
| 5,377,116 | * 12/1994 | Wayne et al. | 700/175 |
| 5,390,127 | * 2/1995 | Tang et al. | 700/146 |
| 5,548,694 | * 8/1996 | Gibson | 345/424 |
| 5,625,575 | * 4/1997 | Goyal et al. | 395/500.27 |
| 5,729,463 | * 3/1998 | Koenig et al. | 700/98 |

OTHER PUBLICATIONS

"A New Interaction Algorithm With Erosion for EPIC–3," Contract Report BRL–CR–540, U.S. Army Ballistic Research Laboratory, Aberdeen Proving Ground, Maryland (1985).

"An Overview of the Way EDSMAC Computes Delta–V," Terry D. Day and Randall L. Hargens, SAE Technical Paper Series No. 880069 (1988).

"A Single Surface Contact Algorithm for the Post–Buckling Analysis of Shell Structures," David J. Benson and John O. Hallquist, *Computer Methods in Applied Mechanics and Engineering*, vol. 78, pp. 141–163 (1990).

"A General–Purpose Contact Detection Algorithm for Non-linear Structural Analysis Codes," M.W. Heinstein, S.W. Attaway, J.W. Swegle, and F.J. Mello, Sandia Report No. SAND92–2141, Sandia National Laboratories (1993).

"Validation of an Analytical Model of a Right–Angle Collision between a Vehicle and a Fixed, Rigid Object," C.A. Grau and R.L. Huston, *IJCrash*, vol. 3, No. 3, pp. 249–264 (1988).

* cited by examiner

*Primary Examiner*—Kevin J. Teska
*Assistant Examiner*—Hugh Jones
(74) *Attorney, Agent, or Firm*—Kolisch Hartwell Dickinson & McCormack & Heuser

(57) ABSTRACT

A method for conducting a computerized simulation of a collision between at least two objects. The method includes creating a representation of each of the objects. Each representation is typically is a mesh of nodes and surface elements. The method also typically includes colliding the representations of the objects such that the representations contact each other, and at least a first representation experiences a respective deformation at each of a plurality of contact points. In addition the method typically includes, for at least a subset of the plurality of contact points, computing a respective local collision force associated with the deformation at such contact points, and calculating a resultant generalized collision force acting at a predetermined point associated with the first representation based on the local collision forces. Typically, the respective local collision force is related to a distance the region of the representation is deformed by a deformation relationship. The method may also include, for at least a subset of the plurality of contact points, calculating a deformation parameter that the first object experienced at the contact point, and restituting a region of the first object adjacent such contact point a restitution distance associated with the deformation parameter. Typically the deformation parameter is cumulative local deformation force, and the deformation parameter is related to the restitution distance by a restitution relationship.

37 Claims, 21 Drawing Sheets

WITHOUT RESTITUTION

WITH RESTITUTION

WITHOUT RESTITUTION

WITH RESTITUTION

WITHOUT RESTITUTION

WITH RESTITUTION

METHOD FOR SIMULATING COLLISIONS

TECHNICAL FIELD

The present invention relates generally to computational dynamics, and more particularly to conducting a computerized simulation of a collision of physical objects, such as vehicles.

BACKGROUND

The National Highway Traffic Safety Administration estimates that 6,764,000 police-reported motor vehicle traffic accidents occurred in the United States in 1997 alone, killing 41,967 and injuring 3,399,000 persons. Unfortunately, each of these traffic accidents often is the beginning in a chain of medical and legal wrangles, which exact a great economic and emotional toll on the accident victims, their families, and society as a whole. As a result, highway safety has become a top priority for the nation.

In an effort to improve our understanding of these accidents, vehicle collisions often are reconstructed using one of several known methods. As a result of these analyses, scientists and engineers are able to make appropriate improvements to highway infrastructure and vehicle design, insurance companies are able to settle claims and manage risk, and courts of law are able to adjudge liability in grievances brought by accident victims.

Before the advent of computing technologies, collisions typically were modeled using known exit or entry conditions, and applying either conservation of momentum or energy principles to solve for unknown parameters. The advent of computing technologies has engendered a new breed of collision analysis, referred to as collision simulation, by which scientists and engineers may look inside a collision and simulate the mechanics of the collision over a large number of discrete time steps. After initial parameters, such as size, mass, position, and velocity of the colliding objects, are input into a collision simulation program for each body, the collision simulation program typically positions each of the bodies, and calculates the collision and external forces acting on each body at each time step.

Collision simulation commonly is practiced using finite element methods, which divide up each of the bodies into a large number of discrete subregions, or finite elements, and calculate the forces acting on each of the finite elements due to transfer of momentum, heat energy, etc., occurring along boundaries with neighboring elements. By examining the collision at each of a large number of finite regions, the overall collision can be simulated for objects having truly arbitrary geometries, thus making finite element analysis extremely powerful as compared to prior solution techniques. In addition, finite element methods typically also include algorithms to model certain phenomena, such as buckling, that depend on non-local geometric properties of the colliding objects.

Finite element collision methods utilize contact algorithms to manage behavior of the elements as they collide. Following movement of the meshes, the contact algorithms perform two essential functions for each element: location and restoration. During location, the position of the element relative to other surface elements is ascertained. During restoration, position and/or topology of the element within the mesh is altered, due to contact with other elements, and forces associated with the alteration of the mesh are calculated based on the mass of each element, according to conservation of momentum principles.

Current finite element contact algorithms typically alternate treating one of the meshes as a master mesh and the other of the meshes as a slave mesh. During a collision, nodes of the slave mesh that penetrate the master mesh are repositioned to conform to the surface of the master mesh. As the slave mesh and master mesh alternate, each mesh conforms to the other, and realistic collision behavior may be simulated.

For example, in *A New Interaction Algorithm with Erosion for Epic*-3, published in U.S. Army Ballistic Research Laboratory Report BRL-CR-540 (February 1985), Ted Belytshchko discloses a method of modeling collisions that searches for penetration of a master surface by a slave node and restores the position of the slave node onto the master surface. The velocity of the restored slave node has been modified according to its new position. The change in momentum experienced by the slave node due to the restoration of its position onto the master surface is apportioned to the master nodes defining the master surface element.

In *A General-Purpose Contact Detection Algorithm for Non-Linear Structural Analysis Codes*, published as Sandia Report 92-2141 (May 1993) available from the National Technical Information Service of Springfield, Va., Heinstein et al. disclose a method of collision simulation that uses a global contact search and a detailed contact search involving the projected motion of both the master and slave surfaces. Penetrating slave nodes then are accelerated out of the master surface with a force proportional to the penetration distance.

Several problems exist with using these contact algorithms to conduct a finite element simulation of a collision. First, each method requires development of a complex three-dimensional structural mesh, which may require weeks of engineering time. The mesh must not only accurately reflect the outer geometry of the object, but also must reflect internal geometry of the object. In addition, the mesh must be constructed to represent material properties of the object at each element, such that the finite element method may calculate various physical quantities based on functional interdependencies between the elements. In particular, each element of the mesh must have an associated mass, such that the method may solve a conservation of momentum equation for each collision between elements, from which solution other physical quantities, such as acceleration, shear, etc., may be derived. Development of such a complicated mesh is both time consuming and expensive.

Second, finite element methods often require significant amounts of computer processing time. A finite element model must conduct calculations to solve for unknown parameters for each element, resulting in a complex system of equations with a large number of unknowns. A small finite element model constructed to simulate static behavior of objects typically may generate a set of ten thousand equations, which are solvable in a reasonable amount of time by a personal computer. To simulate a dynamic collision, such as a vehicle collision, this set of equations must be solved for each of a large number of time steps, typically generating several hundred thousand or millions of equations and requiring a mainframe and/or supercomputer to run.

Because of the time and effort involved in building a mesh, and the cost of processing time on a mainframe or supercomputer, finite element methods typically only are practical for projects with large budgetary resources, such as vehicle design and manufacture. Finite element methods remain impractical for smaller budget projects, such as reconstruction of everyday vehicular accidents, marine accidents, landslides, demolition and ballistic tests, manufacturing processes, etc. Currently, only a very small number of these collisions are reconstructed using traditional finite element methods. It would be desirable to provide a collision simulation method capable of handling arbitrary geometries, yet which does not require a great amount of preparation time, and which may be executed in a few minutes on a personal computer, such that a greater number of these collisions may be reconstructed at a lower cost, in less time.

SUMMARY OF THE INVENTION

A method is provided for conducting a computerized simulation of a collision between at least two objects. The method includes creating a representation of each of the objects. Each representation typically is a mesh of nodes and surface elements. Alternatively, each representation may be a smooth or discretized surface. The method also typically includes colliding the representations of the objects such that the representations contact each other, and at least a first representation experiences a respective deformation at each of a plurality of contact points. In addition the method typically includes, for at least a subset of the plurality of contact points, computing a respective local collision force associated with the deformation at such contact points, and calculating a resultant generalized collision force acting at a predetermined point associated with the first representation based on the local collision forces. Typically, the respective local collision force is related to a distance the region of the representation is deformed by a deformation relationship. The method may also include, for at least a subset of the plurality of contact points, calculating a deformation parameter that the first object experienced at the contact point, and restituting a region of the first object adjacent such contact point a restitution distance associated with the deformation parameter. Typically the deformation parameter is cumulative local deformation force, and the deformation parameter is related to the restitution distance by a restitution relationship.

DETAILED DESCRIPTION OF THE PREFERRED EMBODIMENT

Referring initially to FIGS. 1–4, a method 10 according to the present invention for conducting a computerized simulation of a collision as described above is illustrated. Although a collision between any number of physical objects may be simulated with the present invention, for purposes of illustration only, a collision between a first object and a second object will be discussed. Where the method is used to simulate a collision between more than two objects, the following method typically is called for each pair of colliding objects.

Figure 16:
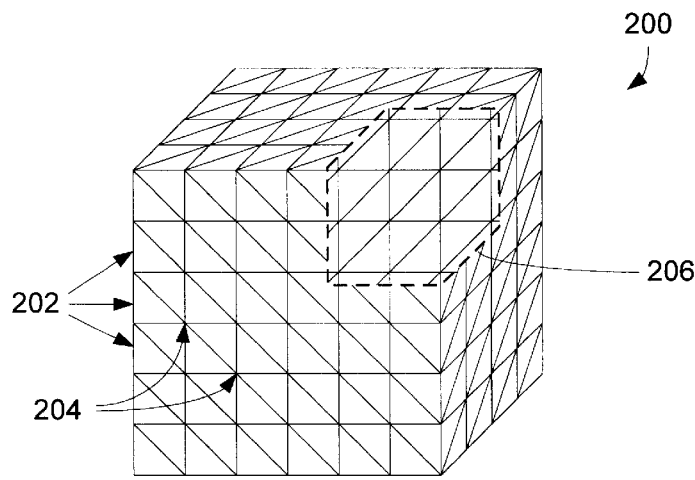
FIG. 16 is a frontal cutaway isometric view of a mesh according to the present invention.
Figure 21:
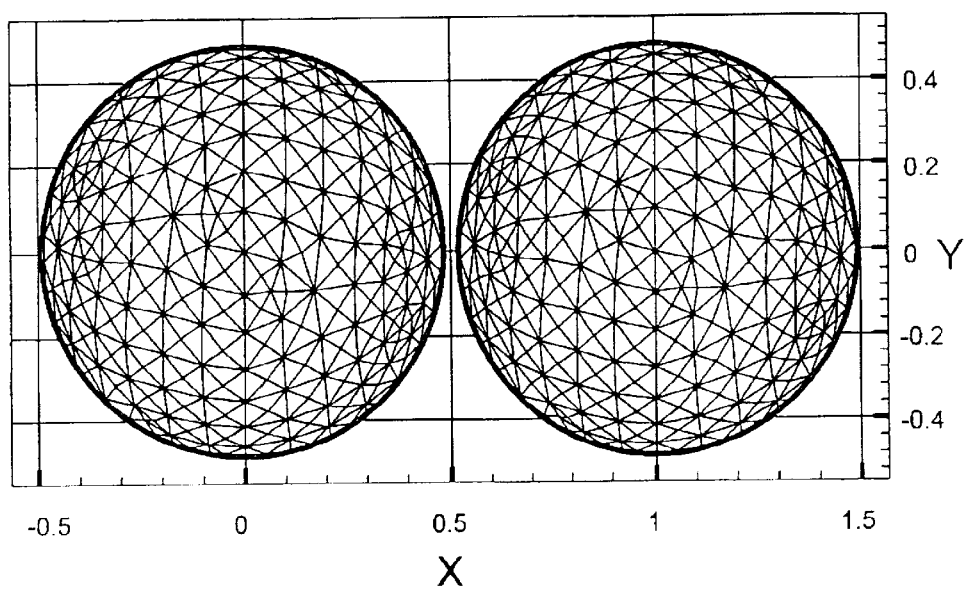
FIG. 21 a is a front view of two spherical meshes in spaced-apart relation.
Figure 25:
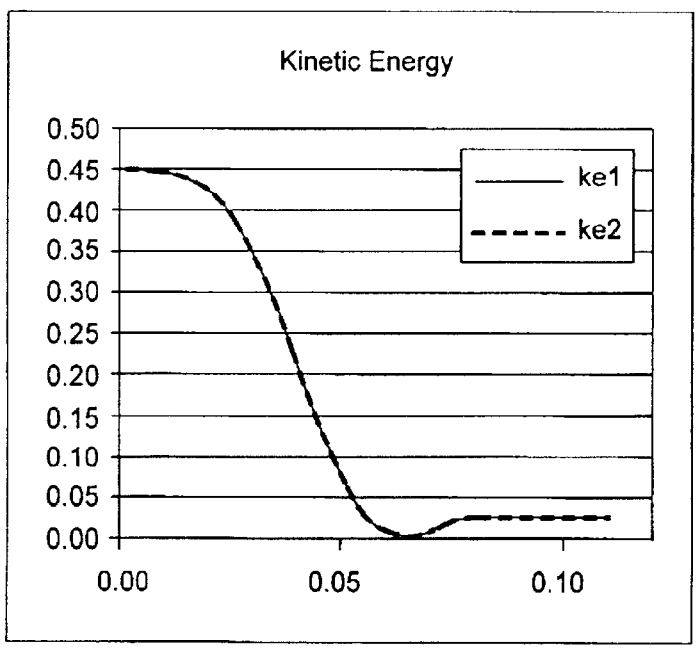
FIG. 25 is a graphical comparison of the kinetic energy of each mesh during the collision of FIG. 22, with restitution of the meshes.

At 12, the method typically includes providing a representation of each object. Typically, the representations will include a first mesh and a second mesh in the form of a respective outer surface of the first object and the second object. FIG. 16 shows a typical embodiment of mesh 200, formed in the shape of the outer surface of a cube. Alternatively, mesh 200 may be formed in virtually any other shape, such as a sphere, as shown in FIG. 21, or a vehicle or pole, as shown in FIG. 25. Mesh 200 typically includes surface elements 202 and nodes 204. Surface elements 202 typically are triangular in shape and cover the entire outer surface of the mesh. Alternatively, surface elements of other shapes may be used, such as hexagonally shaped surface elements, or even irregularly shaped elements. Nodes 204 typically are positioned at the vertices of the surface elements. Alternatively, nodes 204 may be placed anywhere within or on a boundary of a surface element. While the mesh as a whole may be assigned a mass, the surface elements and nodes typically have no mass independently associated therewith. By treating the mesh as only having mass at the center of gravity, the method avoids complex conservation of momentum calculations associated with each surface element, typical of traditional finite element methods.

As shown at cutaway 206, mesh 200 typically is a hollow shell having no thickness. The shell may be in virtually any shape, such as a vehicle shell or an object shell. Alternatively, a solid shell or a shell having a thickness may be provided. Use of a shell representation significantly reduces the number of calculations the disclosed method must perform as compared to typical finite element collision models where the entire three dimensional object representation is filled with elements and nodes, thereby decreasing the time and cost of running a particular collision simulation.

Multiple embedded shells may be used to simulate structures within structures, such as seats within a vehicle. The embedded shells may be associated with a parent shell to move with the center of mass, such as when a vehicle component is attached to the vehicle, or may be free of the parent shell, such as when an unrestrained passenger rides within a vehicle. In this manner, internal damage occurring within an object during a collision may be simulated.

The method 10 alternatively may include providing another representation of the outer surface of the first and second objects. For example, any continuous or discretized geometric surface in the form of the outer surface of the objects may be provided. A continuous surface may be used, for example, when the method is implemented using vector calculus. In this case, the method may model position, motion, and force as continuous vector fields acting on regions of a continuous surface, rather than as discrete vectors acting at discrete points on a mesh. Those skilled in the art will appreciate that any discretized representation of position, motion, or force is merely a computational approximation of a continuous representation of that phenomena, and that either representation may be used in the present method. In addition a discretized surface other than a mesh may be used, such as a pointillized surface, that is, a surface approximated by a plurality of discrete points.

Figure 5:
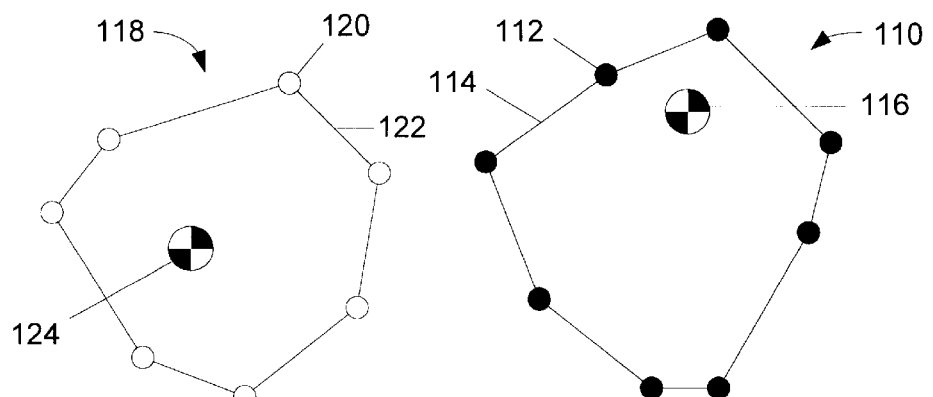
FIG. 5 is a top view of a first and a second two-dimensional surface in a spaced-apart relation.

In FIG. 5, a two-dimensional representation of the first mesh or surface 110 and the second mesh or surface 118 is shown. The principles described with reference to the two-dimensional meshes shown in FIGS. 5–15 are understood to apply equally to three-dimensional meshes such as mesh 200 of FIG. 16.

Returning to FIGS. 1–4, method 10 further includes, at 14, assigning a deformation relationship and a restitution relationship, also collectively referred to as a force deflection relationship, to each of the first and second meshes or surfaces. Deformation and restitution, as the terms are used herein, respectively refer to two phases of a collision between objects, the first phase involving inward deflection of an outer surface of the object, and the second phase involving outward rebounding of the outer surface following deformation.

During a collision of objects, energy is transferred between the objects, resulting in a change of motion and/or structure of each of the objects as a result of the collision force. Collisions can generally be classified into perfectly elastic, partially inelastic, and perfectly inelastic collisions. In a perfectly elastic collision, such as is approximated when two billiard balls collide, the surfaces of the objects temporarily deform during the collision, but fully return, or restitute, to their original shapes. No permanent deformation occurs, and virtually all of the energy of transferred during the collision is kinetic energy, or energy of motion.

In a partially inelastic collision, such as may occur when vehicles collide, the surfaces of the vehicles deform a distance, and then only partially rebound, or restitute, leaving a permanent dent in the surface. During deformation some energy is stored by the structure as potential energy, and the remaining energy is dissipated as heat or work energy due to structural damage. During restitution, stored potential energy from the collision is transferred back into kinetic energy, exerting a rebound or restitution force on each vehicle.

In a perfectly inelastic collision, such as may occur between two colliding lumps of clay, the objects deform, but do not restitute, and no rebound force is felt by the objects. All of the energy from the collision is absorbed as heat and work energy by the clay objects.

The deformation relationship assigned to each mesh describes the behavior of the surface of the object during deformation, and the restitution relationship describes the behavior of the surface of the object during restitution. By varying the deformation and restitution relationships for each mesh, a perfectly elastic, partially inelastic, or perfectly inelastic collision may be simulated.

Figure 17:
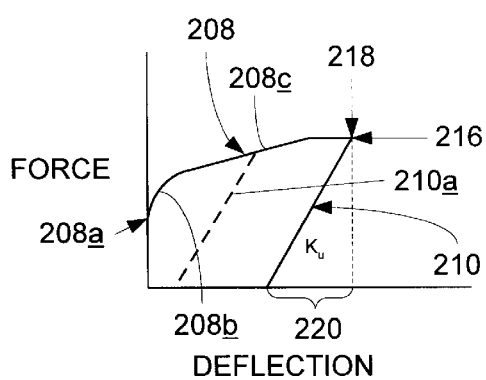
FIG. 17 is a force deflection relationship according to the present invention.
Figure 18:
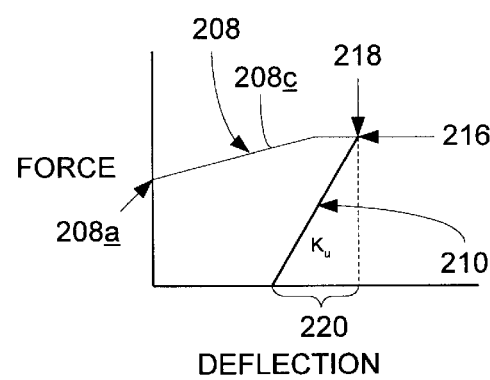
FIG. 18 is another embodiment of a force deflection curve according to the present invention.

As shown in FIGS. 17 and 18, deformation relationship 208 typically relates the amount of force required to cause a given deflection in a particular region of mesh 200. As shown in FIG. 17, for vehicle collisions, deformation relationship 208 typically includes a curved region 208b extending from a Y-intercept 208a of the deformation relationship to a linearly sloped region 208c, which terminates in a saturation force region 208d. In FIG. 18., curved region 208b is omitted and linear portion 208c extends to the Y-axis. To avoid a computational discontinuity at the Y-intercept, deformation relationship 208 also may include a null band extending from the origin and rising steeply to meet curved region 208b. The null band ensures that the method will correctly model forces caused by very small deflections. Typically, deformation relationship 208 is derived from empirical crash test data. Alternatively, deformation relationship 208 may be virtually any other linear or nonlinear relationship.

Restitution relationship 210 relates a deformation parameter, such as cumulative deformation force or distance, experienced by a region of the mesh to a total restitution distance that the region of the mesh will attempt to restitute. The restitution relationship may determine, for example, how far a region of a vehicle will rebound depending on how deep the region has been crushed or deformed. For vehicle collisions, restitution relationship 210 typically is a linear unloading slope extending from the force deformation relationship to the X-axis. Alternatively, a non-linear restitution relationship may be used, such as a piecewise smooth curve. If the collision is elastic, the restitution relationship will mirror the deformation relationship. If the collision is perfectly inelastic, the restitution relationship will be a vertical line extending from the deformation curve to the X-axis so that no rebound force is created. The area under the deformation curve 208 represents energy absorbed by the mesh during loading, and the area under the restitution curve 210 represents the energy dissipated by the mesh during restitution.

The deformation and restitution relationships may also include multiple profiles. For example, the method may include sampling the deformation rate, and if the deformation rate is below a threshold, applying a first deformation and restitution profile to simulate, for example, a low speed elastic collision between bumpers, and if the deformation rate is above a threshold, applying a second restitution profile to simulate, for example, a high speed partially inelastic collision between fenders. Alternatively, the deformation and restitution relationships may be of a continuously varying profile, which profile may be dependent on deformation rate, restitution rate, node velocity, or some other physical parameter.

Alternatively, it will be appreciated that the deformation and restitution relationship may be based on energy transferred during the collision. The deformation relationship, for example, may relate a deformation distance to an absorbed quantity of energy. Similarly, the restitution relationship may relate a deformation parameter, such as cumulative deformation distance or force, to a total restitution energy that the surface attempts to release during restitution.

Typically, the deformation relationship and restitution relationship assign a common restitution behavior to all regions of a mesh, and the mesh exhibits the same stiffness properties at each of its nodes. Alternatively, a spatially varying deformation relationship and/or restitution relationship may be employed, such that each node of the mesh may exhibit a unique deformation and restitution behavior. For example, a front region of the mesh may be assigned a high stiffness, and a top region of the mesh may be assigned a low stiffness, and both of these areas may be assigned a common restitution relationship.

Referring again to FIGS. 1 through 4, the method, at 16, typically includes assigning a set of initial conditions to each of the first and second meshes. This set of initial conditions typically includes initial position, velocity, and acceleration, as well as a mass and center of gravity associated with each mesh. Typically, these initial conditions are applied to a respective center of mass of each mesh, and movement for each node of the mesh is computed based upon these initial conditions at the center of mass. The nodes and surface elements typically have no associated mass. The initial conditions also may be applied at a location other than the center of mass, and/or only to a portion or region of the mesh or surface. For example, to simulate the collision of objects with independently moving parts, such as the collision of two helicopters, certain initial motion conditions may only be applied to those parts of the helicopters that are moving, namely the rotors.

At 18, the method typically includes moving or repositioning the meshes according to the initial conditions and other environmental forces, such as friction and wind resistance, that may be present in the simulation model. After movement according to the initial conditions, the method typically loops though a series of discrete time steps, generally indicated by the loop between 18 and 22. At each time step, collision and external forces acting on the meshes are calculated, and the meshes are moved under the influence of these forces. Typically, both of the meshes are moved at each time step. Alternatively, only one of the meshes may be moved per time step.

At 20, the method typically detects a gross collision occurring between the first and second mesh. Gross collision detection may be achieved by drawing a boundary box around each of the first and second meshes, and detecting a collision between the boundary boxes. Each boundary box further may include subregions such that gross collision detection includes detection of collision between a subregion of the first boundary box and a subregion of a second boundary box, such that a specific location of the collision may be ascertained. If no gross collision has occurred between the boundary boxes, the method, at 22, detects whether each of the meshes is at rest or has contacted a boundary region or condition of the simulation environment. Typically, the condition is separation of the boundary boxes of each mesh. Alternatively, the boundary may be a bounded region in three-dimensional space.

At 24, where both meshes are at rest or have contacted the boundary of the simulation environment, the method ends. Where one of the meshes still is in motion or has not contacted a boundary of the simulation environment, the method returns to 18 to move the meshes and detect for gross collision.

Figure 2:
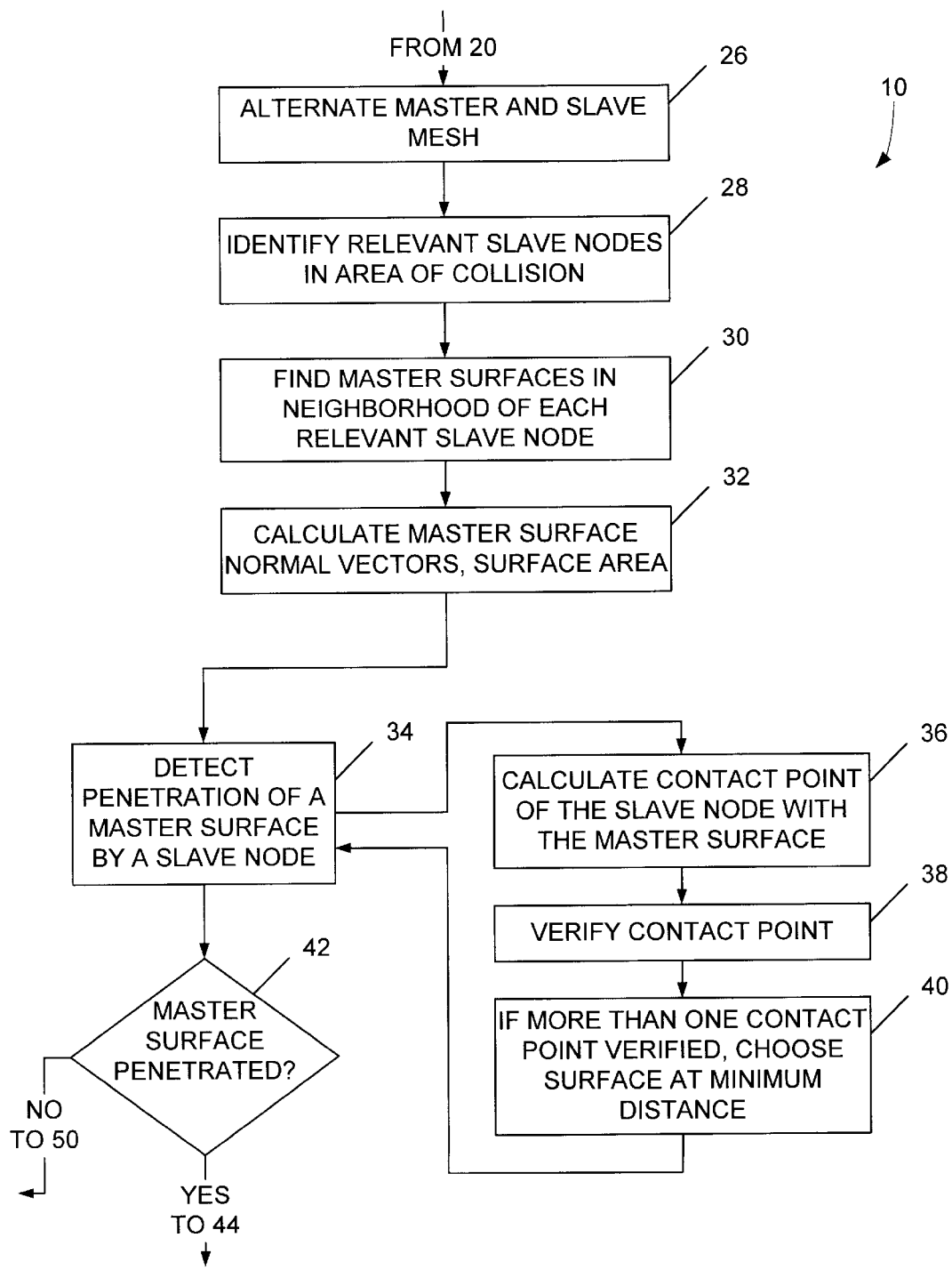
FIG. 2 is a continuation of the flowchart of FIG. 1.
Figure 3:
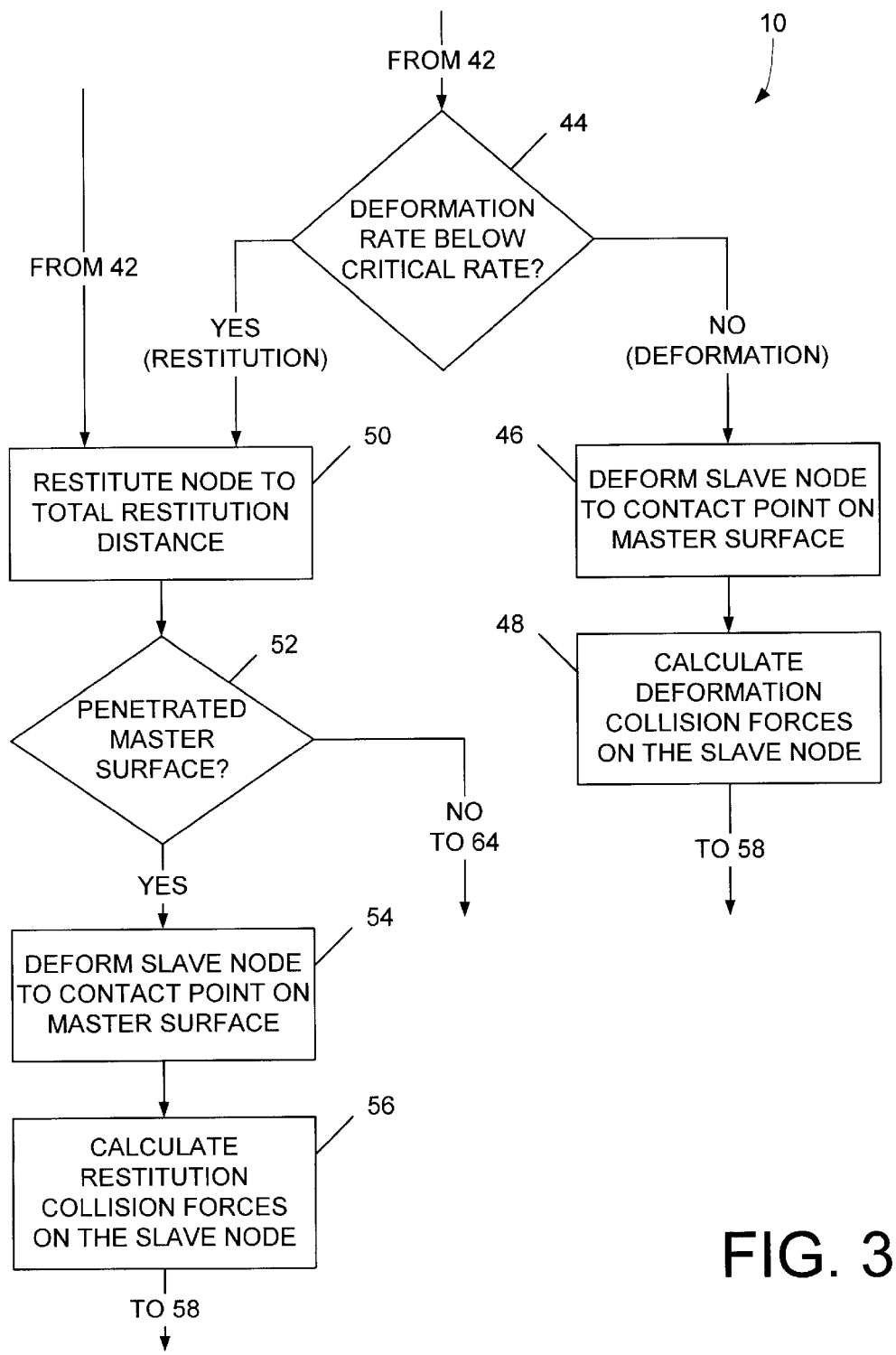
FIG. 3 is a continuation of the flowchart of FIG. 2.

Referring to FIG. 2 at 26, if a gross collision is detected between the respective boundary boxes, the method typically further includes alternately assigning the first mesh to be a master mesh and the second mesh to be a slave mesh, and assigning the first mesh to be a slave mesh and the second mesh to be a master mesh. Typically, each mesh assumes the role of the slave mesh and the master mesh once per time step. For a given time step, the mesh assigned to be a slave mesh defoims itself to enforce contact with the surface of the master mesh. Alternatively, the role of master and slave mesh may be alternated more or less frequently, such as every other time step or four times per time step. The meshes are able to converge more accurately upon a surface of contact when multiple alternations between master and slave mesh per time step are employed. At 28, the method further includes identifying relevant slave nodes in an area affected by the collision. At 30, the method typically includes finding those master surfaces that lie within a neighborhood of each relevant slave node in the area affected by the collision. Typically, master surfaces in the neighborhood of a slave node are found by drawing a bounding box around the slave node and searching for any master surfaces that lie within the bounding box. Alternatively, every master surface may be checked for penetration by a slave node, and step 30 may be omitted. At 32, master surface normal vectors, shown at 137 in FIG. 6, and surface area values typically are calculated in preparation for collision detection. Alternatively, the master surface normal vectors and surface area values may be calculated after collision detection.

At 34, the method further includes detecting penetration of a master surface by a slave node. Typically, each of the master surfaces within a neighborhood of a slave node affected by the collision is checked to determine whether the slave node has penetrated the master surface. To perform the detection at 34, the method typically calculates a contact point, verifies the contact point, and, where multiple contact points are verified, chooses the closest contact point to the slave node.

At 36, the contact point of the slave node with the master surface is calculated according to the formula:

$$\bar{x}_{cp} = \bar{x}_s + \bar{v}\alpha$$

where $\bar{x}_{cp}$ is a vector from an origin to the contact point of the slave node on the master surface, $\bar{x}_s$ is a vector from the origin to the slave node in the precontact position, $\bar{v}$ is a velocity vector for the slave node, and $\alpha$ is a scalar value given by the formula:

$$\alpha = \frac{(\bar{x}_i - \bar{x}_s) \cdot \bar{n}}{\bar{v} \cdot \bar{n}}$$

where $\bar{x}_i$ is a vector from the origin to any of the vertices of the master surface, $\bar{x}_s$ is a vector from the origin to the slave node, and it is a unit vector normal to the master surface element. Typically, the origin is point common to each mesh. Alternatively, as shown in FIGS. 5–15, an origin for each mesh may exist at a center of mass for each mesh. Alternatively, virtually any other method of computing the position of the contact point between the master surface and the path of the slave node may be utilized.

Figure 6:
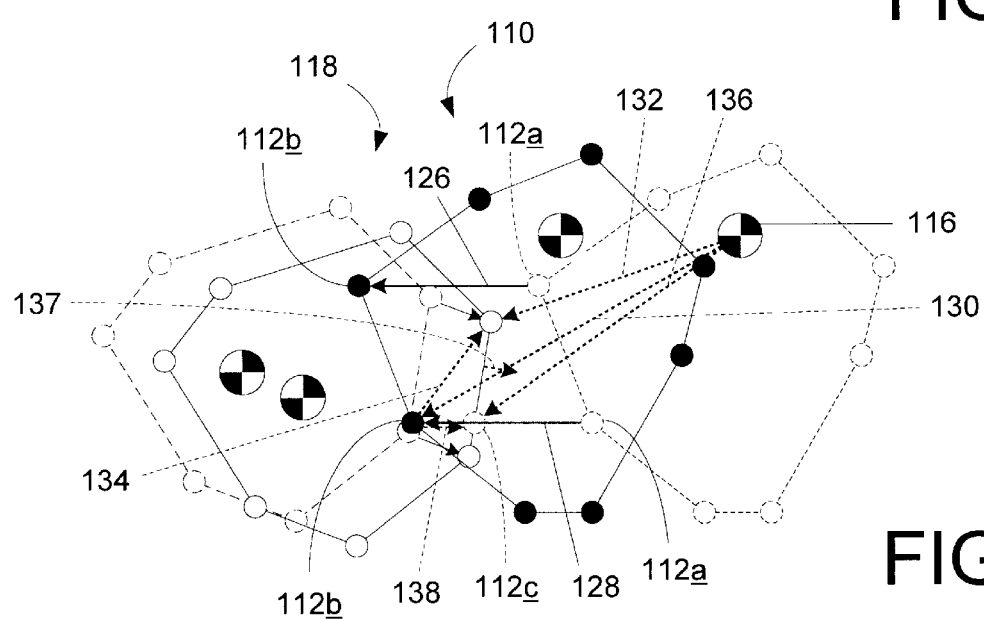
FIG. 6 is a top view of the first surface penetrating the second surface.
Figure 7:
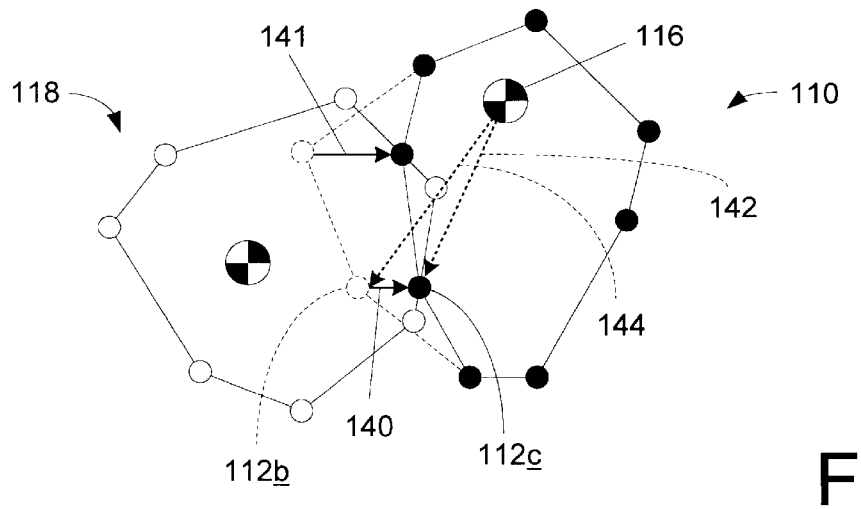
FIG. 7 is a top view showing the first surface deforming.

Referring to FIGS. 5–7, penetration of the master surfaces by the slave nodes and calculation of the contact point is shown. In FIG. 5, a first mesh 110 including nodes 112, surface elements 114, and center of mass 116 is positioned in a spaced-apart relation relative to a second mesh 118. The second mesh includes nodes 120, surface elements 122, and center of mass 124. In FIGS. 5–7, the first mesh 110 is assigned to be the slave mesh and the second mesh 118 is assigned to be the master mesh. For illustration purposes, FIGS. 5–15 show vectors for each mesh in a local coordinate system with an origin centered at the center of gravity of each mesh. Typically, for ease of computation, position, velocity, and force vectors for each mesh are calculated in a common global coordinate system.

As shown in FIG. 6, the first mesh 110 is moved or repositioned into an intersecting orientation relative to second mesh 118. Nodes 112 of the first mesh travel along respective velocity vectors, $\bar{v}$, labeled 126 and 128, which vectors extend from a pre-contact position 112a of the respective slave node to a penetration position 112b. The contact point, at 112c, is typically determined by calculating a vector, $\bar{x}_{cp}$, at 136, by adding vector $\bar{x}_s$, at 130, to the vector $\bar{v}\alpha$, at 138. The scalar $\alpha$ is found by subtracting vector $\bar{x}_s$, at 130, from $\bar{x}_i$, at 132, to yield vector 134, calculating the dot product of the vector 134 and $\bar{n}$, at 137, and then subsequently dividing said dot product by the dot product of $\bar{v}$, at 128, and $\bar{n}$.

Referring again to FIG. 2, the contact point calculated at 36 is verified at 38. Verification of the contact point is typically accomplished by several computations. First, the method typically includes verifying that the dot product of $\bar{v}$, at 128 in FIG. 6, and $\bar{n}$ at 137, is not equal to zero. If the dot product is zero, the slave node is traveling parallel to the master surface element, and could not have penetrated the master surface element. Because dividing by zero theoretically yields a result of infinity and will cause most computers to give erroneous output, this calculation may be performed before the contact point is calculated. Second, where the method utilizes a three-dimensional mesh with triangular surface elements, as shown in FIG. 18, the sum of the areas of each of three triangular subregions 212a 212b and 212c is confirmed to be approximately equal to the area of surface element 202, as expressed by the equation:

$$\sum A_i = A_{ijk}$$

A contrary result indicates that the calculated contact point is not actually contiguous with the surface element, but is above or below the surface element, because the sum of the area of the three interior subregions of the triangle should equal the area of the triangle as a whole. Third, the dot product of $\bar{v}$, at 128, and a vector $\bar{h}$ extending from the contact point 112c to the penetration position 112b of the slave node in the opposite direction of vector 138, is confirmed to be greater than zero. This verifies that the contact point is in back of the penetration position of the slave node. Fourth, the dot product of $\bar{n}$, at 137, and $\bar{h}$, is confirmed to be negative. This verifies that master surface is in back of the penetration position of the slave node. Returning to FIG. 2 at 40, where more than one contact point is verified, the method typically further includes choosing the contact point at a minimum distance from the slave node. This may occur, for example, where a slave node passes through a front and back surface of a thin section of an object in one time-step.

At 42, if, despite the earlier indication at 20 that the bounding boxes collided, no penetrated master surfaces are detected, the method proceeds to restitution calculations, at 50. Where a penetrated master surface element is detected, the method, at 44, determines whether the penetrating node has a deformation rate below a critical deformation rate. The deformation rate of a node is calculated by taking the time derivative of the deformation vector, $\Delta\bar{\delta}$, shown at 140 in FIG. 7. The critical deformation rate typically is set to a value at or slightly above zero. Therefore, the critical deformation rate will be reached at approximately the time a particular node stops penetrating the master surface. This occurs when the node has decelerated to a near stop relative to the master surface. A critical deformation rate value slightly above zero typically is chosen to avoid computational waste involved with allowing the deformation rate to approach or fall below zero. Of course, smaller values of the critical deformation rate will lead to more accurate, but computationally intensive solutions. Thus the critical deformation rate is chosen to yield a reasonable accuracy and within a reasonable calculation time. If the critical deformation rate has been reached, the method will proceed to calculate restitution forces produced by the collision. If the critical deformation rate has not been reached, the node is still colliding into the master mesh.

Where the deformation rate is not below the critical deformation rate, at 46, the method includes deforming the slave node to the calculated contact point, at 112c in FIG. 6, on the master surface. Deformation typically occurs in an opposite direction and parallel to the velocity vector for the respective slave node. Alternatively, other deformation trajectories may be used.

Figure 8:
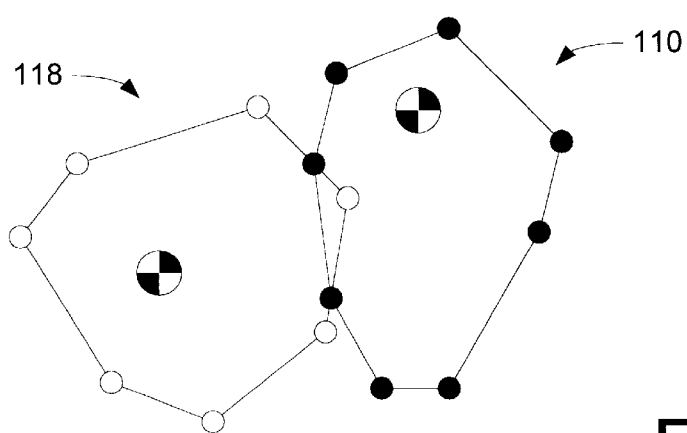
FIG. 8 is a top view showing the surfaces after deformation of one of the objects.
Figure 9:
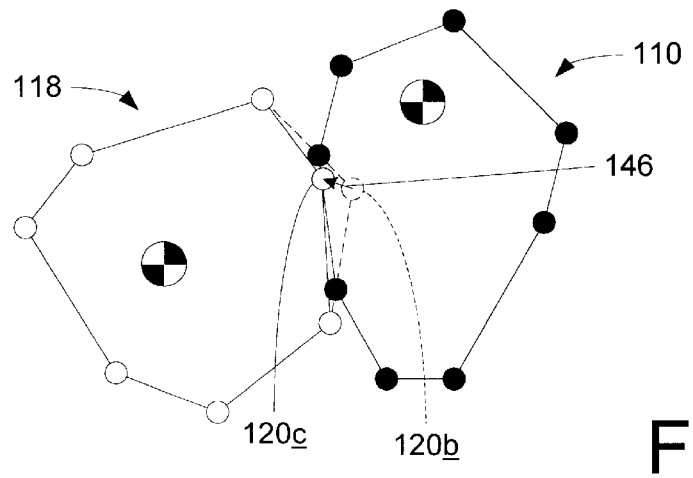
FIG. 9 is a top view showing the second surface deforming to the first surface.
Figure 10:
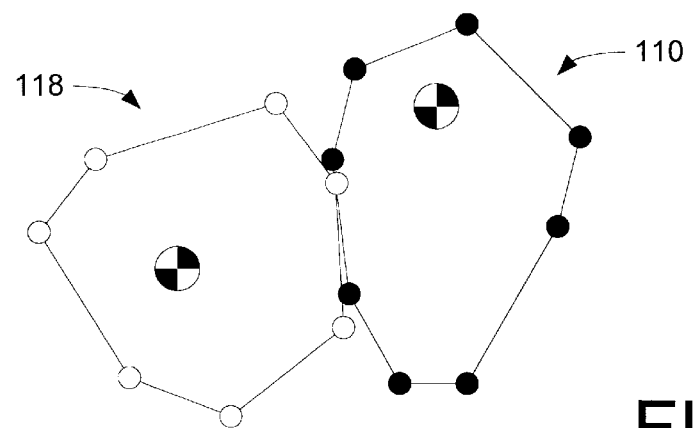
FIG. 10 is a top view of the surfaces after deformation of the second surface.

FIGS. 8–10 illustrate the deformation process where the second mesh 118 is assigned to be the slave mesh, and the first mesh 110 is assigned to be the master mesh. In FIG. 8, the second mesh is shown in an intersecting orientation with respect to the first mesh. In FIG. 9, the slave node at the penetration position 120b deforms along deformation vector 146 to contact point 120c. In FIG. 10, the second mesh is shown deformed onto the first mesh. Typically, the movement and deformation illustrated in FIGS. 5–10 occurs during one time step. Alternatively, the first and second meshes may deform during alternate time steps.

At 48, the method includes calculating a local collision force acting at the node due to deformation of the node. Deformation forces are related to penetration depth or deformation distance according to the deformation relationship 208. Typically, collision forces due to deformation are calculated according to the formula:

$$\vec{F}_{s,coll} = f(\Delta\vec{\delta})A_s \frac{\Delta\vec{\delta}}{|\Delta\vec{\delta}|}$$

where $f_d(\Delta\vec{\delta})$ is the deformation relationship function operating on the deformation vector $\Delta\vec{\delta}$, $A_s$ is an area associated with the node to be described below, and $$\frac{\Delta\vec{\delta}}{|\Delta\vec{\delta}|}$$

is a unit vector pointing in the direction of $\Delta\vec{\delta}$. The deformation relationship may be virtually any relationship relating force to deformation, such as may be expressed by an $n^{th}$-order polynomial series:

$$F_{coll} = k_0 + k_1|\Delta\vec{\delta}| + k_2|\Delta\vec{\delta}|^2 + \ldots + k_n|\Delta\vec{\delta}|^n + K|\Delta\dot{\vec{\delta}}|$$

where $k_0$ through $k_n$ are polynomial coefficients and K is a damping coefficient. FIG. 17 depicts a deformation relationship 208 calculated according to a $3^{rd}$ order polynomial equation, without damping force. Alternatively, a damping force based on the rate of deformation, as expressed by $$K|\Delta\dot{\vec{\delta}}|,$$

may be applied.

In FIG. 18, a deformation relationship 208 based upon a first order polynomial is illustrated. Typically, in linear region 208c, the polynomial coefficients $k_2$ through $k_n$, and the damping coefficient K reduce to zero, and the deformation relationship may be expressed:

$$f(\Delta\vec{\delta}) = (\tilde{A} + \tilde{B}|\Delta\vec{\delta}|)$$

where $\tilde{A}$ is the y-intercept of linear portion 208c and $\tilde{B}$ is the slope of the linear portion 208c. Typically, $\tilde{A}$ and $\tilde{B}$ are derived from industry-standard stiffness coefficients A and B obtained from crash test data. A is an industry-standard coefficient representing the Y-intercept of a force deflection curve and B is an industry-standard coefficient representing the slope of the force deflection curve relating force per unit width to deflection distance. Typically, the values for $\tilde{A}$ and $\tilde{B}$ may be found according to the equations:

$$\tilde{A} = \frac{A}{H} \text{ and } \tilde{B} = \frac{B}{H},$$

where H is the height of the impact, typically 30 inches.

Therefore, for linear deformation, a collision force vector acting at the slave node may be calculated by the formula:

$$\vec{F}_{s,coll} = (\tilde{A} + \tilde{B}|\Delta\vec{\delta}|)A_s \frac{\Delta\vec{\delta}}{|\Delta\vec{\delta}|}$$

Figure 19:
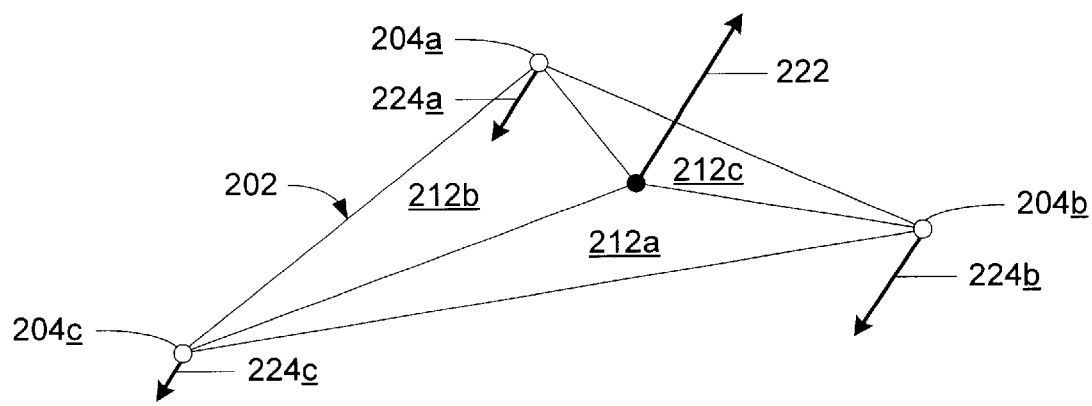
FIG. 19 is a triangular surface element of the present invention.
Figure 20:
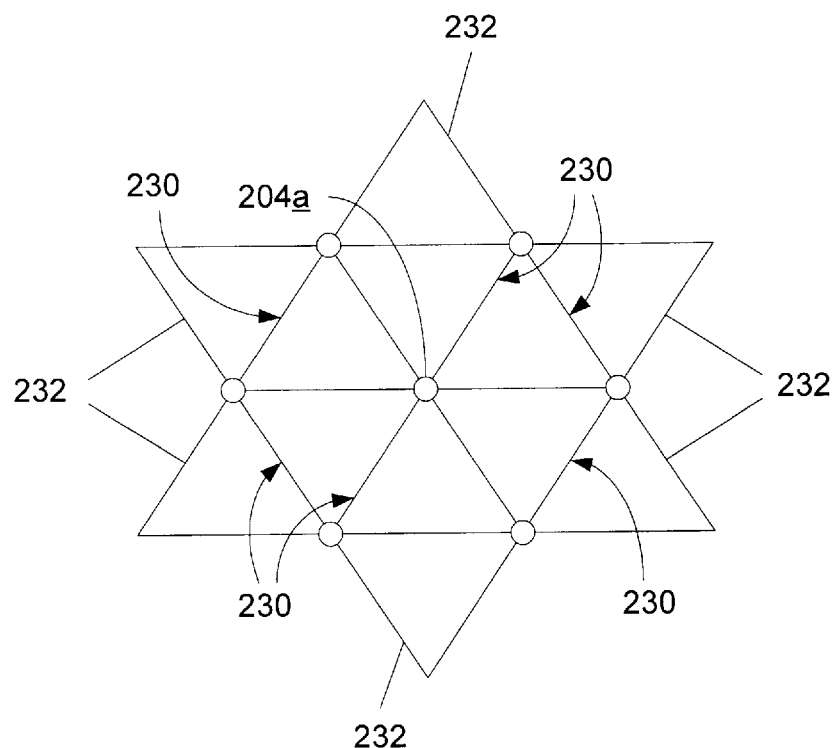
FIG. 20 is a detailed view of surface elements neighboring a node.

As shown in FIG. 19, first level neighbor surfaces 230 of a node 204a are defined to be those surfaces contiguous with the node, and second level neighbor surfaces 232 are defined to be those surfaces that share a side with the first level neighbor surfaces, but which are not contiguous with the node. Typically, a collision force acting on a node or contact point does not cause a force to be exerted on neighbor nodes. This independence of nodes significantly reduces the computational complexity of a collision simulation according to the present method, as compared to traditional finite element methods, and enables the present method to operate with massless nodes and surface elements.

To model incidental damage occurring in regions adjacent the immediate collision zone, the deformation relationship may also include a surface stiffness relationship relating a distance between two regions or nodes on the surface to a tension or compression force felt by each of the two regions or nodes due to expansion or contraction of the distance between the nodes. According to the surface stiffness relationship, as two nodes are pulled apart by the collision, they exert a force upon each other related to the separation distance. This surface stiffness relationship may be a $n^{th}$ order polynomial series and may also include a damping force, as described above for a generalized collision force due to deformation.

The area, $A_s$, associated with the slave node is typically calculated by dividing the sum of the areas of the first level neighbor surfaces of the slave node by the number of nodes per surface element. For triangular meshes, the following equation results:

$$A_s = \frac{1}{3}\sum_{i=1}^{n} A_i$$

where n is the number of connected neighbor surfaces and $A_i$ is the area of the $i^{th}$ neighbor surface. Once collision forces due to deformation are calculated, the method proceeds to 58, where the collision forces from deformation and restitution are apportioned to the master surface elements.

Returning to 44 in FIG. 3, where the deformation rate falls below a critical rate, that is, the region or node of the object nearly stops deforming inward, the method typically includes attempting to restitute or rebound the node a total restitution distance. Typically, the total restitution distance, $\delta_u$, is found according to the equation:

$$\delta_u = \frac{\max|\vec{F}_{s,coll}|}{K_u}$$

where, $\max|\vec{F}_{s,coll}|$ is a maximum or cumulative local collision force value, indicated at 216 in FIG. 17, experienced during the loading or deformation of a particular node, and $K_u$ is the unloading slope or restitution relationship, indicated at 210. This local collision force value may be determined by calculating the total local deformation distance 218, a particular node experiences over a series of time steps, and relating that total local deformation distance to a force according to the deformation relationship 208. Once the maximum collision force value is determined, a related total restitution distance 220 may be calculated according to the restitution relationship $K_u$, at 210. Where the maximum local collision force is lower, $K_u$ will shift toward the Y-axis, such that it intersects the deformation relationship 208 at the maximum local collision force, as shown at 210*a*.

Figure 11:
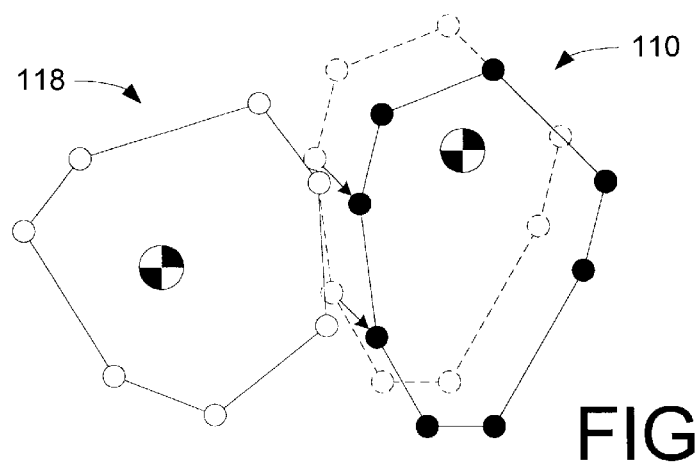
FIG. 11 is a top view of the first surface moving away from the second surface.
Figure 12:
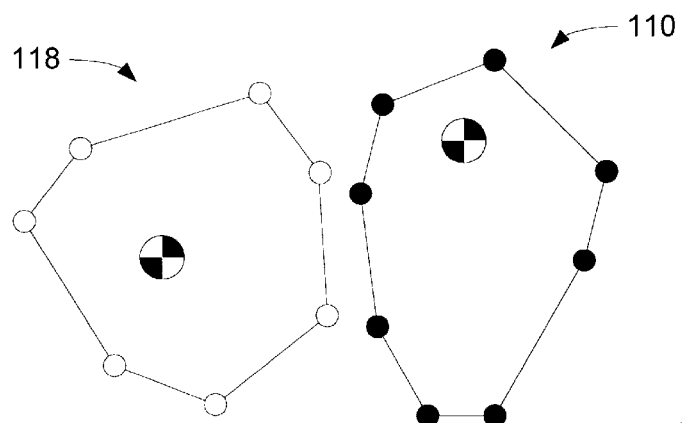
FIG. 12 is a top view of the surfaces in spaced-apart relation.
Figure 13:
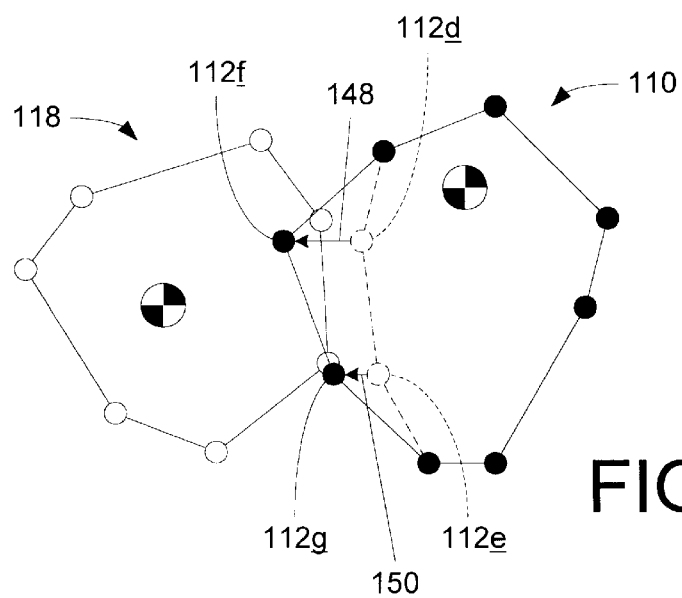
FIG. 13 is a top view of the second surface restituting into the first surface.

Turning now to FIGS. 11–13, the restitution process will be described. In FIG. 11, the first mesh is shown subsequent to movement away from the second mesh. In FIG. 12, the first mesh and the second mesh are shown in spaced-apart relation relative to each other. In FIG. 13, two nodes of the first mesh attempt to restitute the total restitution distance along restitution vectors 148, 150 from positions 112*d* to 112*f* and from 112*e* to 112*g*, respectively. The magnitude of vectors 148, 150 is determined by relating the total restitution distance for each node to a cumulative local deformation force according to the deformation relationship 208. In the example shown in FIGS. 5–15, only one deformation step per mesh occurs, and the total deformation distance of restitution vectors 148, 150 is related to deformation vectors 140, 141, respectively. Where the first mesh deforms over multiple time steps, the total deformation distance of each node over the multiple time steps is used to find the cumulative or maximum local deformation force. The direction of a restitution vector is determined by calculating a local displacement vector from the original position, in local coordinates, of the node before any deformation occurred, to the current, post deformation, position of the node, in local coordinates. The restitution vector typically is parallel to this local displacement vector. After the restitution in FIG. 13, the node at 112*f* is in a penetration position relative to the second mesh, however the node at 112*g* has not penetrated the second mesh.

Figure 14:
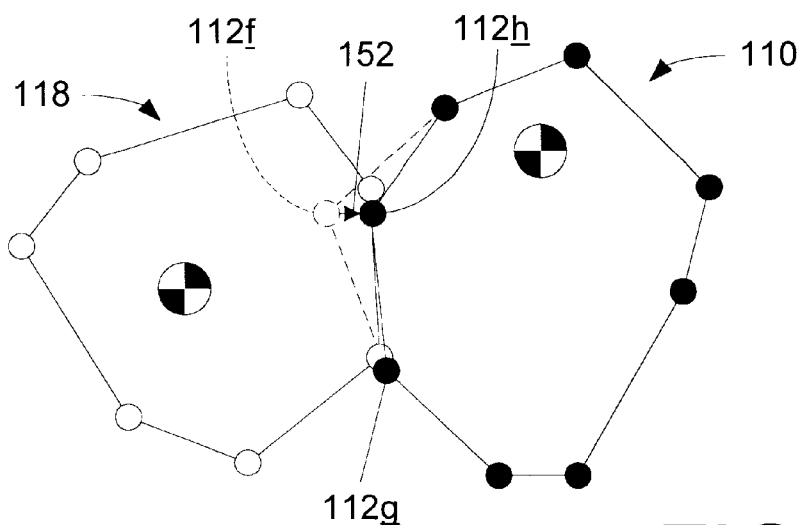
FIG. 14 is a top view showing the second surface being deformed onto the first surface.
Figure 15:
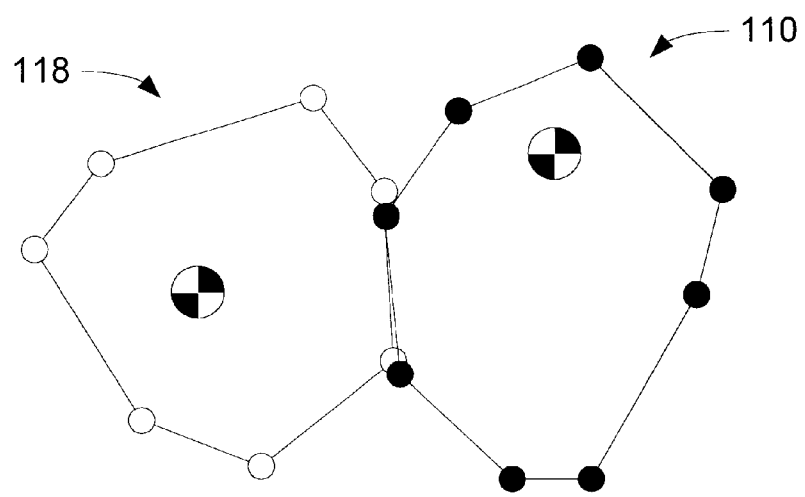
FIG. 15 is a top view showing the surfaces after the second surface has been restituted and deformed.

Referring again to FIG. 3, at 52, the method includes detecting whether a master surface element has been penetrated during restitution. Penetration of the master surface element by the slave node is detected as described above for deformation and shown in FIG. 2 at 34. Where a master surface is penetrated, the method, at 54, deforms the slave node to a contact point on the master surface. Calculation of the contact point and deformation of the slave node to the master surface during restitution is accomplished as described above and in FIG. 2 at 36–40 for deformation. The difference between the distance the node has restituted up until a current time step and the total restitution distance is referred to as an unfulfilled restitution distance. Where no master surface penetration is detected at 54, the method proceeds to 64 in FIG. 4 to calculate any external forces acting on the meshes. As shown in FIG. 14, the node at 112*f* deforms a deformation distance along deformation vector 152 to a contact position at 112*h*.

The node at 112*g* will not attempt to restitute further in a successive time step because the node has reached its total restitution distance. However, at each successive time step, the node at 112*h* will attempt to restitute until the total restitution distance, 148, is achieved.

Turning again to FIG. 3, at 56 collision forces due to restitution are calculated. Collision forces due to restitution typically are calculated similar to collision forces due to deformation, as described above and at 48 in FIG. 3. The collision force due to restitution is related to the unfulfilled restitution distance at each time step by the deformation relationship. Generally, the greatest collision forces due to restitution are felt as the restitution process begins, from which point the magnitude of the collision forces due to restitution gradually taper to zero until the restituting regions of the meshes permanently separate or rebound sufficiently to reduce the restitution force to zero, or until friction of some other external force prevents further restitution.

Figure 4:
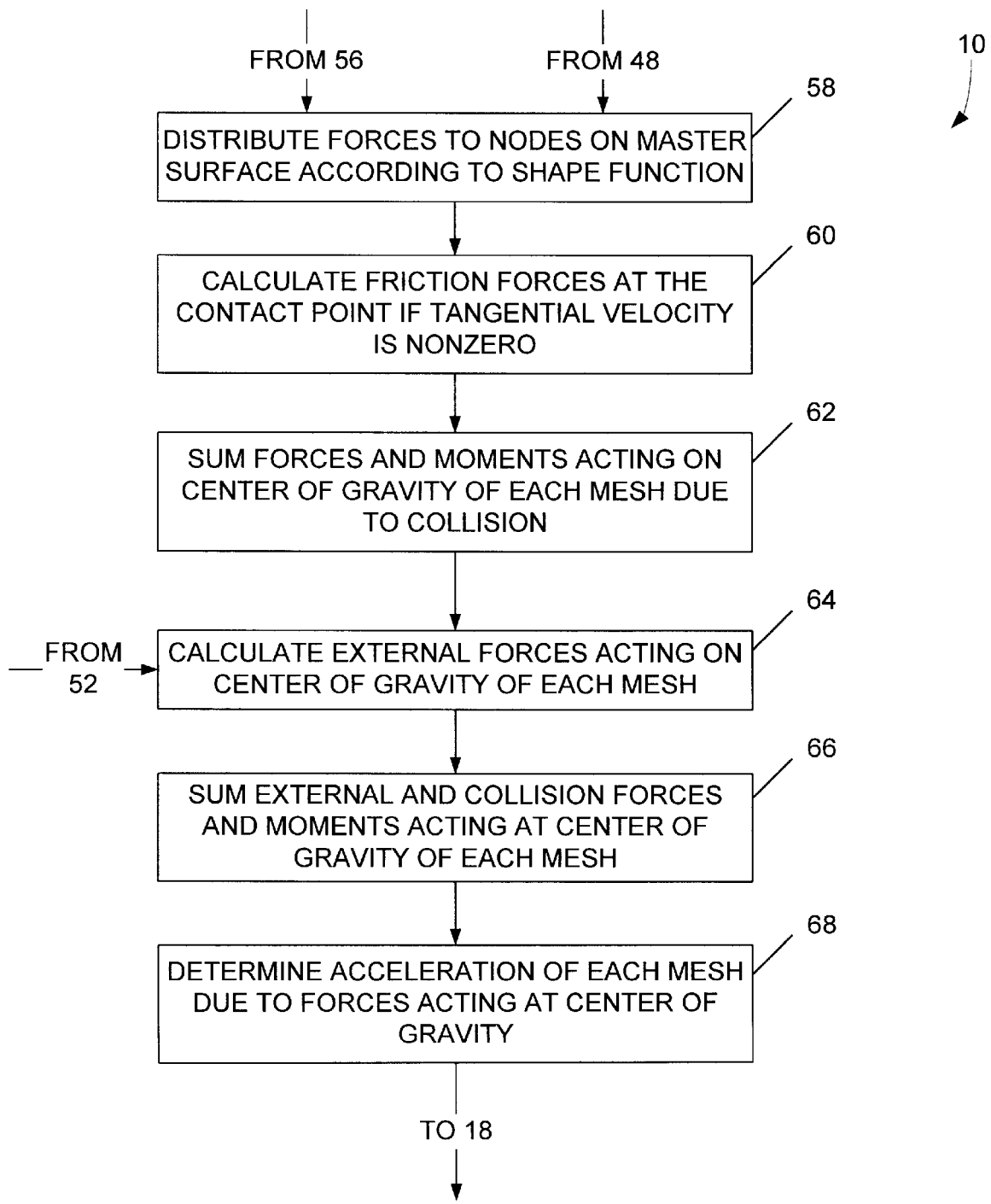
FIG. 4 is a continuation of the flowchart of FIG. 3.

At 58 in FIG. 4, the method typically further includes distributing the collision forces due to deformation and restitution from the slave node to the penetrated master surface element. Typically, the method calculates the magnitude of the collision forces, $F_i$, for node i on the master surface according to the relationship:

$$F_i = |\vec{F}_{s,coll}| L_i$$

where $L_i$ is a shape function expressed by the equation:

$$L_i = \frac{A_i}{\sum_{j=1}^{3} A_j}$$

and $A_i$ is the area of the triangular subregion opposite the node i, and:

$$\sum_{j=1}^{3} A_j$$

is the total area of the master surface element.

As shown in FIG. 18, $F_{s,coll}$, at 222 is apportioned to nodes 204*a*, 204*b*, and 204*c* on master surface 202 to produce resultant forces 224*a*, 224*b*, and 224*c* respectively. For node 204*a*, $A_i$ is 212*a*. Typically, the resultant collision forces 224*a*, 224*b*, and 224*c* acting on the master surface act in a direction normal to the master surface. Alternatively, the resultant collision forces may act in a direction parallel to the force, $F_{s,coll}$, acting on the slave node, or in some other direction.

At 60, the method typically includes calculating the friction forces at the contact point. Typically, friction forces are only calculated if relative tangential velocity between the slave node and the penetrated master surface is nonzero. Friction forces, denoted $F_f$, are typically calculated according to the formula:

$$F_f = (\vec{F}_{s,coll} \cdot \vec{n}) \mu$$

where $F_{s,coll}$ is the collision force acting on the slave node, $\vec{n}$ is the master surface normal vector, and $\mu$ is a coefficient of friction for the master surface.

At 62, the collision forces acting on each mesh are summed to produce a resultant generalized collision force and moment acting at a common or predetermined point, typically the center of gravity of each mesh. It will be understood that the collision forces may be equivalently summed around any common point inside or outside of the meshes to produce an equivalent force moment pair acting at the common point. Typically the magnitude of forces acting at the center of gravity in the x, y, and z directions, respectively, are calculated from the force $F_i$ acting at each of a number of damaged nodes, $N_d$, according to the equations:

$$F_{x,cg} = \sum_{i=1}^{N_d} F_{i_{x,coll}}$$

$$F_{y,cg} = \sum_{i=1}^{N_d} F_{i_{y,coll}}$$

$$F_{z,cg} = \sum_{i=1}^{N_d} F_{i_{z,coll}}$$

Moments acting at the center of gravity or at another common point in the x plane, y plane, and z plane, respectively, are calculated according to the equations:

$$M_{x,cg} = \sum_{i=1}^{N_d} \left(-F_{i_{y,coll}} z_i + F_{i_{z,coll}} y_i\right)$$

$$M_{y,cg} = \sum_{i=1}^{N_d} \left(-F_{i_{z,coll}} x_i + F_{i_{x,coll}} z_i\right)$$

$$M_{z,cg} = \sum_{i=1}^{N_d} \left(-F_{i_{x,coll}} y_i + F_{i_{y,coll}} x_i\right)$$

where x, y, and z are local coordinates of each damaged node relative to the center of gravity.

At 66, the method typically includes summing the external forces and the collision forces and moments to produce a generalized resultant force moment pair acting at the center of gravity of each mesh. Although the center of gravity is often used for simplicity of calculation, it will be understood that the generalized resultant force moment pair may be calculated at a common point other than the center of gravity. External forces may include gravity, aerodynamic drag, road-vehicle friction, or any other external force acting on the colliding objects.

At 68, the method further includes determining the acceleration of each mesh in each of the x, y, and z, directions. Typically this is accomplished according to the equations:

$\Sigma F_x = m(\dot{u} - vr + wq)$ $\Sigma F_y = m(\dot{v} - ur + wp)$ $\Sigma F_z = m(\dot{w} - uq + vp)$ $\Sigma M_x = I_{xx}\dot{p} + qr(I_{zz} - I_{yy})$ $\Sigma M_y = I_{yy}\dot{q} + pr(I_{xx} - I_{zz})$ $\Sigma M_z = I_{zz}\dot{r} + pq(I_{yy} - I_{xx})$ where m is sprung mass, u, v, and iv are forward, lateral, and vertical velocity, p, q, and r, are roll, pitch, and yaw velocity, and $I_{jj}$ is inertia about a j axis. The method may also calculate products of inertia for each node or region of the mesh with respect to each of a combination of planes, and resolve the products of inertia into a resultant acceleration force.

Figure 1:
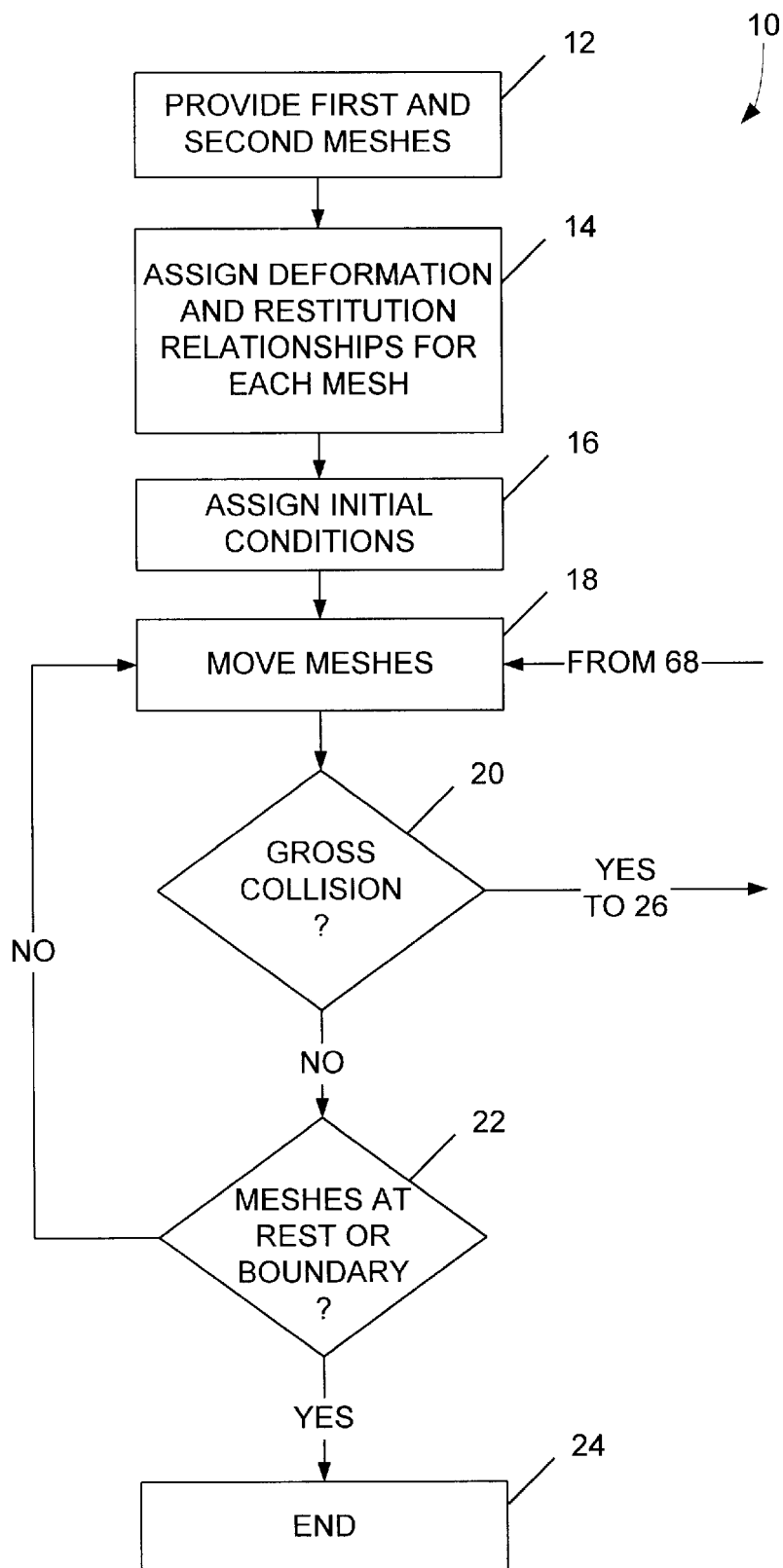
FIG. 1 is a flowchart showing a method for conducting a computerized simulation of a collision according to the present invention.

After calculating the acceleration vectors associated with each mesh, the method typically proceeds to 18 in FIG. 1, and moves each mesh using any suitable integration method to calculate position and velocity of the nodes, such as the Runge-Kutta and Adams-Moulton methods. For a typical collision between two two-thousand-node meshes, the method may be executed on a personal computer with a 233 MHZ microprocessor in approximately three seconds per time step, or about 5–10 minutes for an entire collision. This represents a significant reduction in run time compared to traditional finite element methods. Typically, the method moves each node of each mesh according to the forces acting at a common or predetermined point, such as the center of gravity. Alternatively, the method moves a region or portion of each mesh according to the forces acting at the center of gravity of such region or portion.

The disclosed embodiment continues simulating the collision of the meshes by progressing through a series of time steps, each involving some or all of the above described processes of moving, deforming, calculating forces, and again moving the meshes. The simulation continues until the meshes have each come to rest or reached a boundary of the simulation environment.

Figure 22:
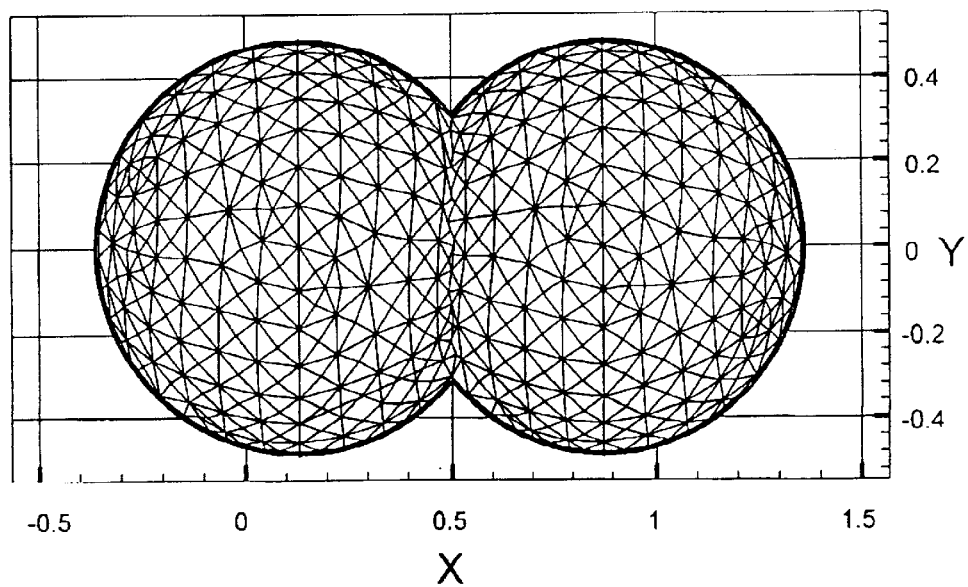
FIG. 22 a is a front view of the two spherical meshes of FIG. 21 after colliding.
Figure 23A:
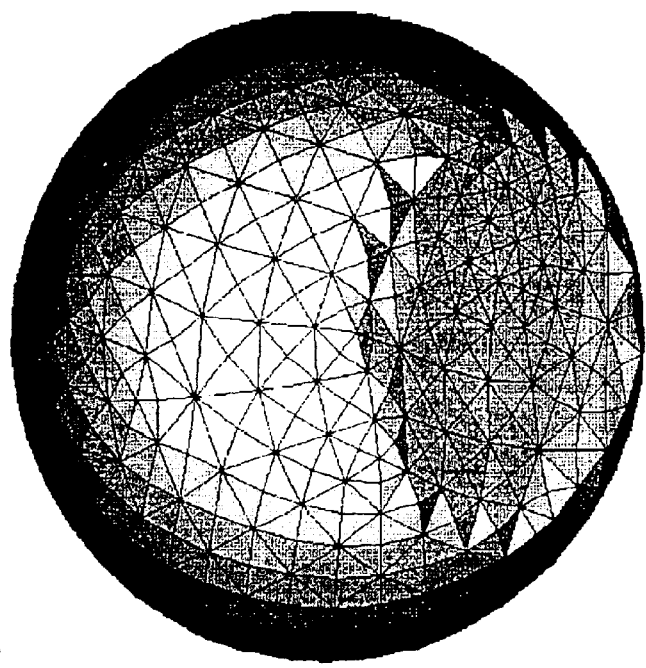
FIG. 23A is a top front isometric view of one of the meshes of FIG. 21 during restitution.
Figure 23B:
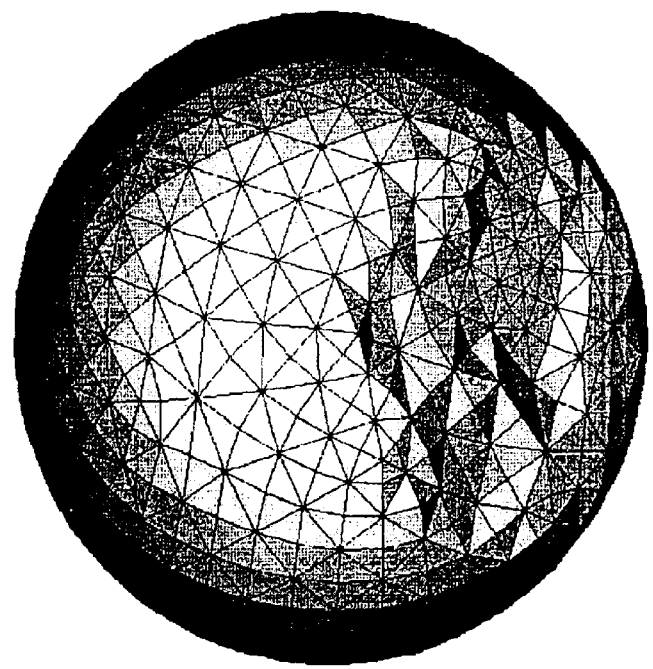
FIG. 23B is a top front isometric view of the mesh of FIG. 23A at a later time step.
Figure 23C:
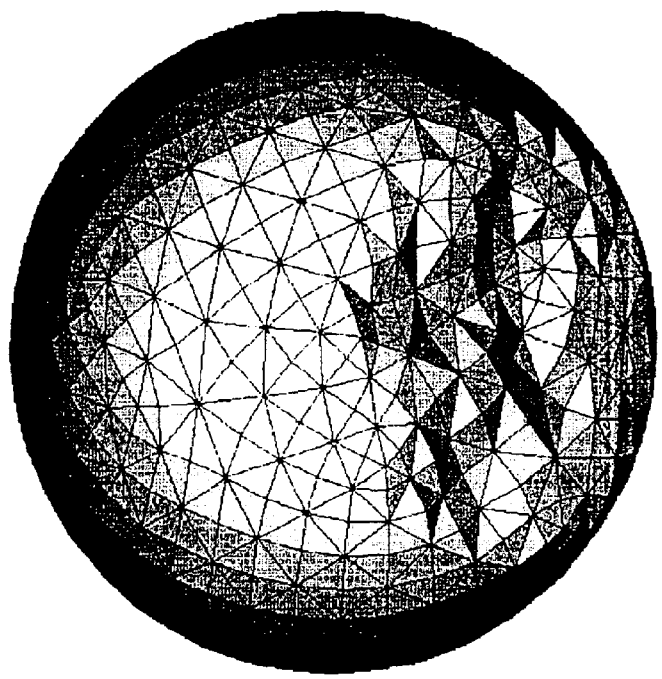
FIG. 23C is a top front isometric view of the mesh of FIG. 23B at a later time step.
Figure 23D:
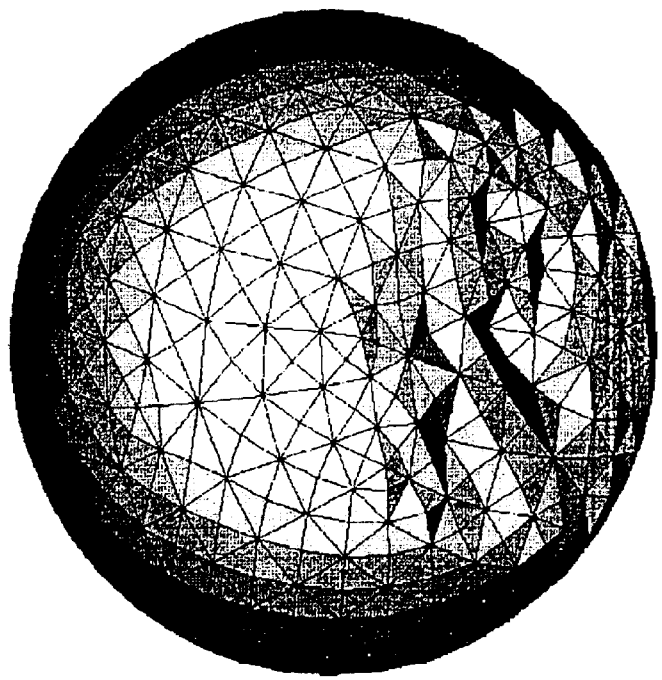
FIG. 23D is a top front isometric view of the mesh of FIG. 23C at a later time step.
Figure 24:
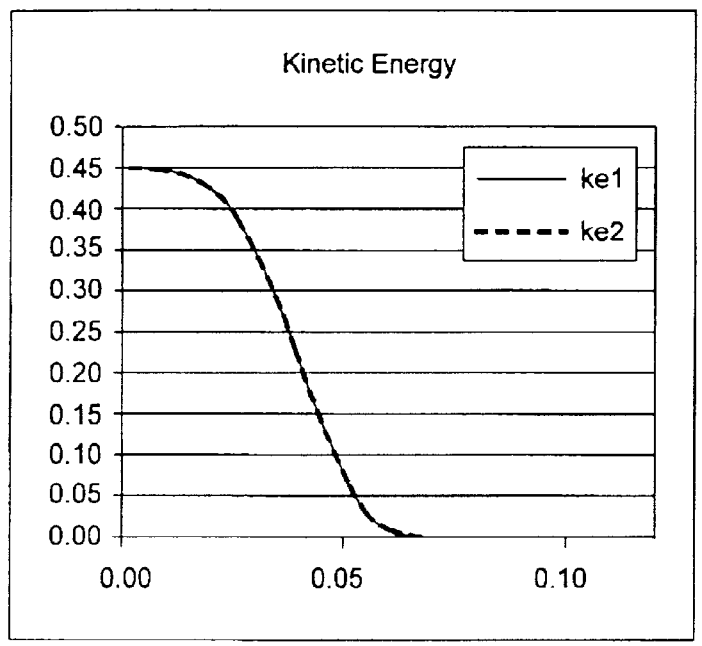
FIG. 24 is a graphical comparison of the kinetic energy of each mesh during the collision of FIG. 22, without restitution of the meshes.
Figure 26:
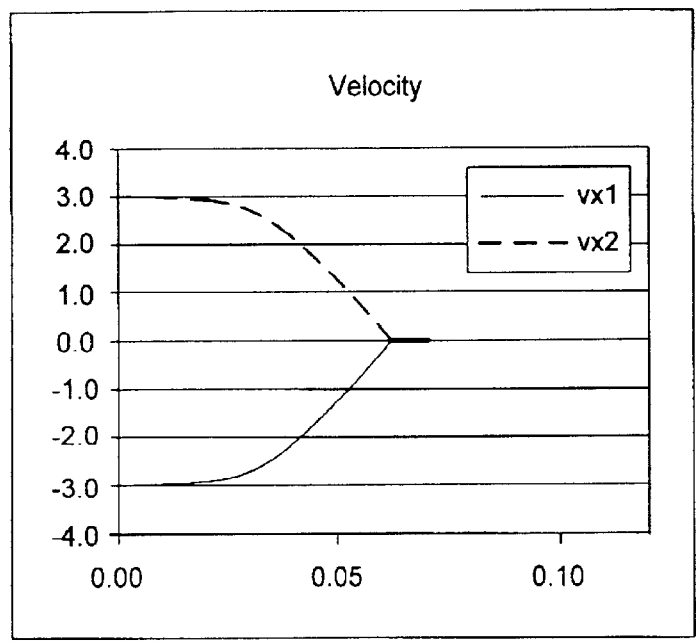
FIG. 26 is a graphical comparison of the velocity of each mesh during the collision of FIG. 22, without restitution of the meshes.
Figure 27:
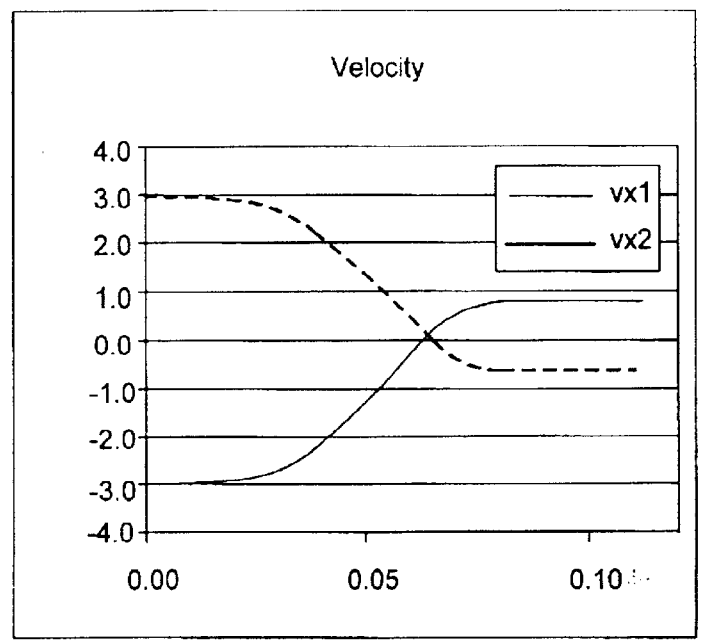
FIG. 27 is a graphical comparison of the velocity of each mesh during the collision FIG. 22, with restitution of the meshes.
Figure 28:
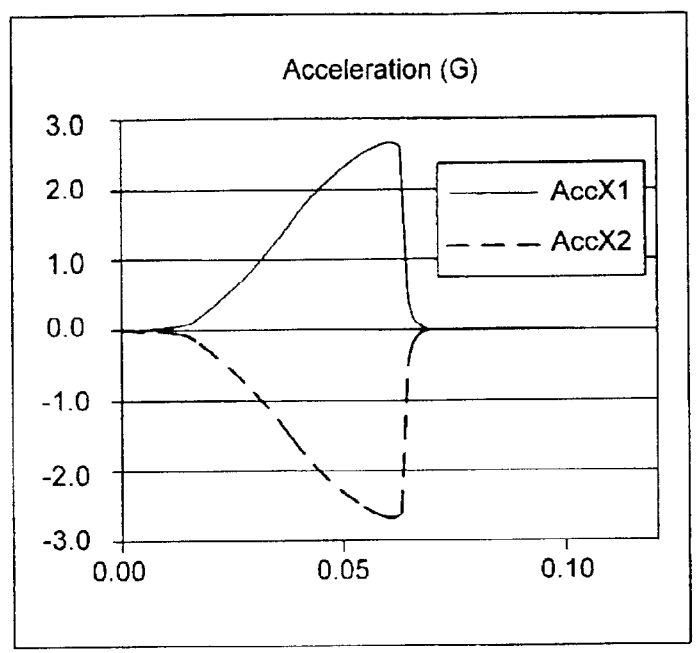
FIG. 28 is a graphical comparison of the acceleration of each mesh during the collision of FIG. 22, without restitution of the meshes.
Figure 29:
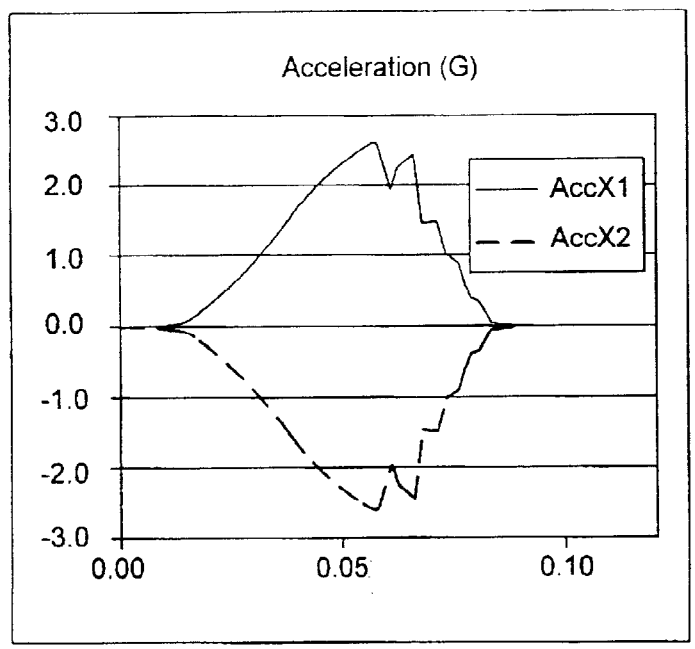
FIG. 29 is a graphical comparison of the acceleration of each mesh during the collision of FIG. 22, with restitution of the meshes.

Referring now to FIGS. 21–34D, output of a computer program designed to implement a method of simulating a collision between objects according to the present invention is illustrated. In FIG. 21, a first and second mesh shaped in the form of an outer surface of a first and second spherical object, respectively, are positioned in a spaced-apart configuration. In FIG. 22, the meshes are shown in a colliding orientation. The region of each mesh affected by the collision can be seen to be substantially flat. In FIGS. 23A–23D, one of the spherical meshes of FIG. 21 is shown restituting during each of four time steps. In FIGS. 24 and 25 the kinetic energy of the meshes in a collision such as depicted in FIG. 22 is graphically compared without restitution and with restitution, respectively. In FIGS. 26 and 27 the velocity of the meshes in a collision such as depicted in FIG. 22 is graphically compared without restitution and with restitution, respectively. In FIGS. 28 and 29 the acceleration of the meshes in a collision such as depicted in FIG. 22 is graphically compared without restitution and with restitution, respectively.

Figure 30:
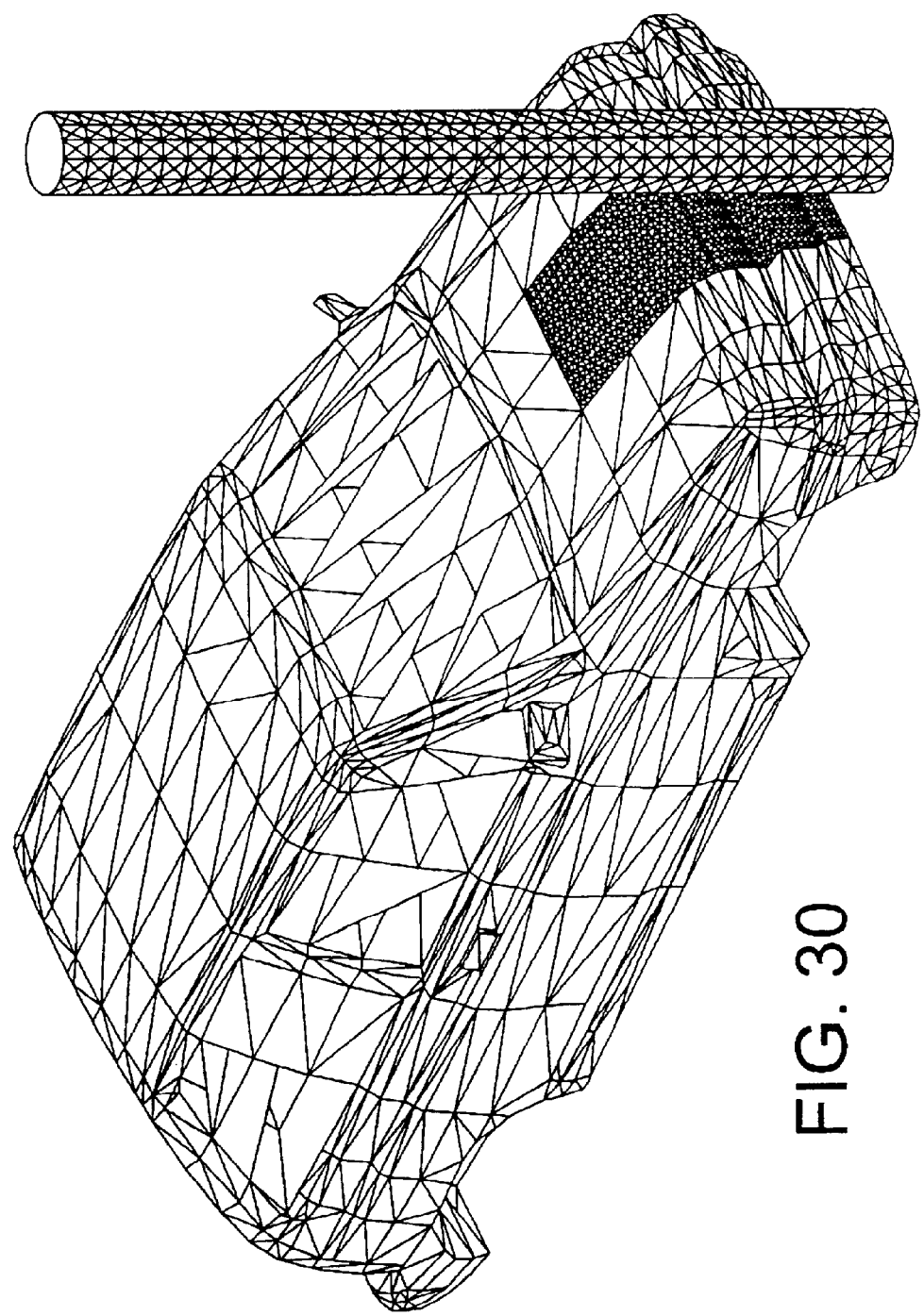
FIG. 30 is a top front isometric view of a vehicle immediately prior to a collision with a pole.
Figure 31A:
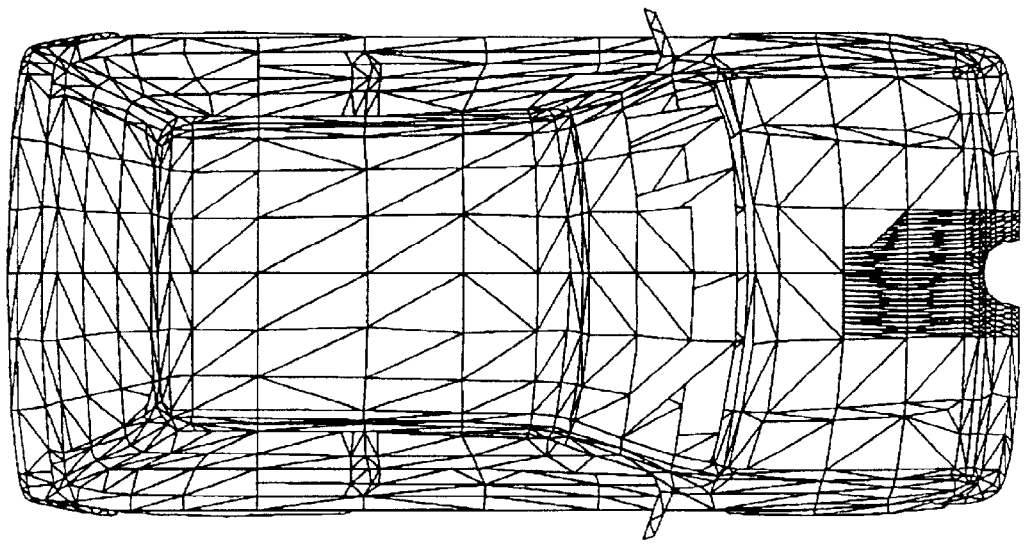
FIG. 31A is a top view of the vehicle of FIG. 30 at 20 milliseconds into the collision with the pole.
Figure 31B:
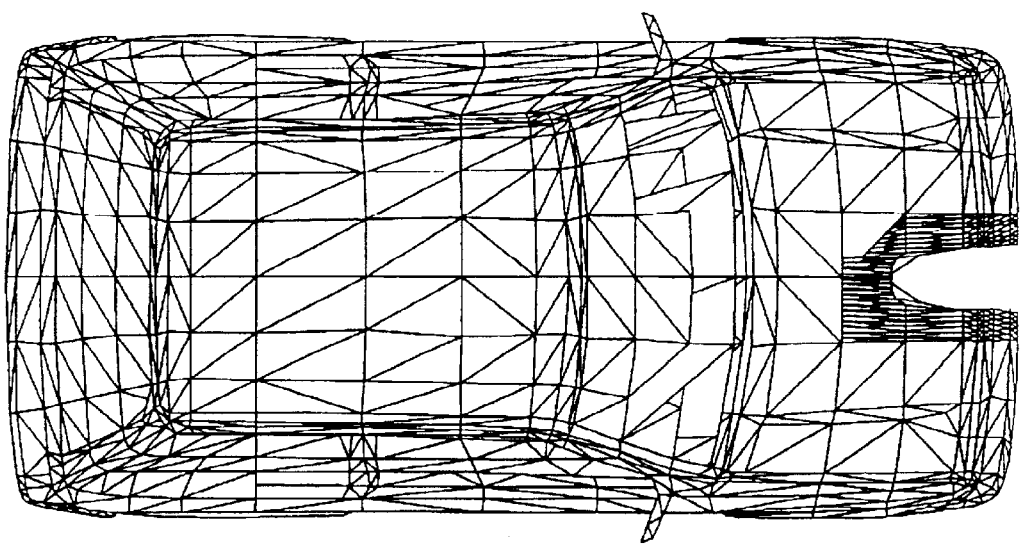
FIG. 31B is a top view of the vehicle of FIG. 30 at 80 milliseconds into the collision with the pole.
Figure 31C:
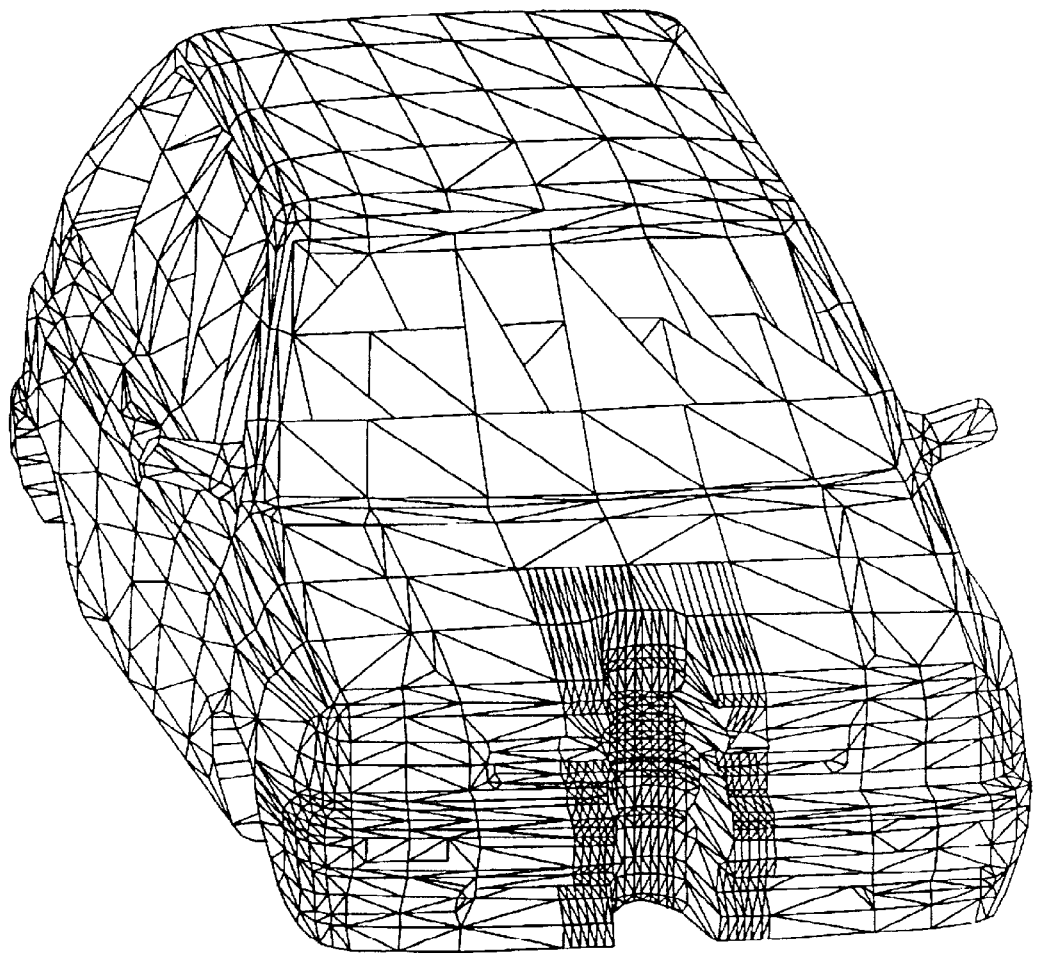
FIG. 31C is an isometric view of the vehicle of FIG. 30 at 100 milliseconds into the collision with the pole.
Figure 32:
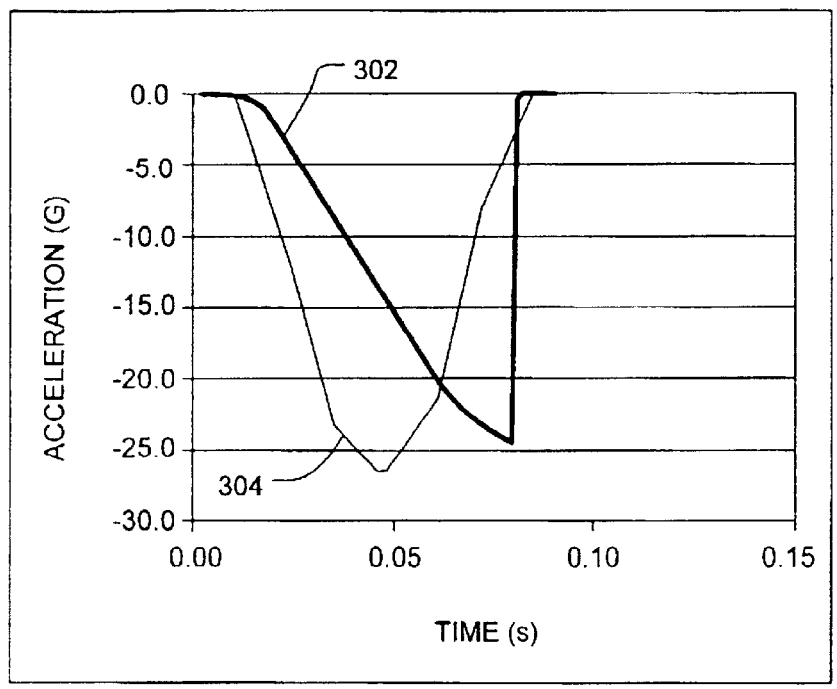
FIG. 32 is a graphical comparison of acceleration calculated by a method according to the present invention and another finite element method for the collision of FIG. 30.
Figure 33:
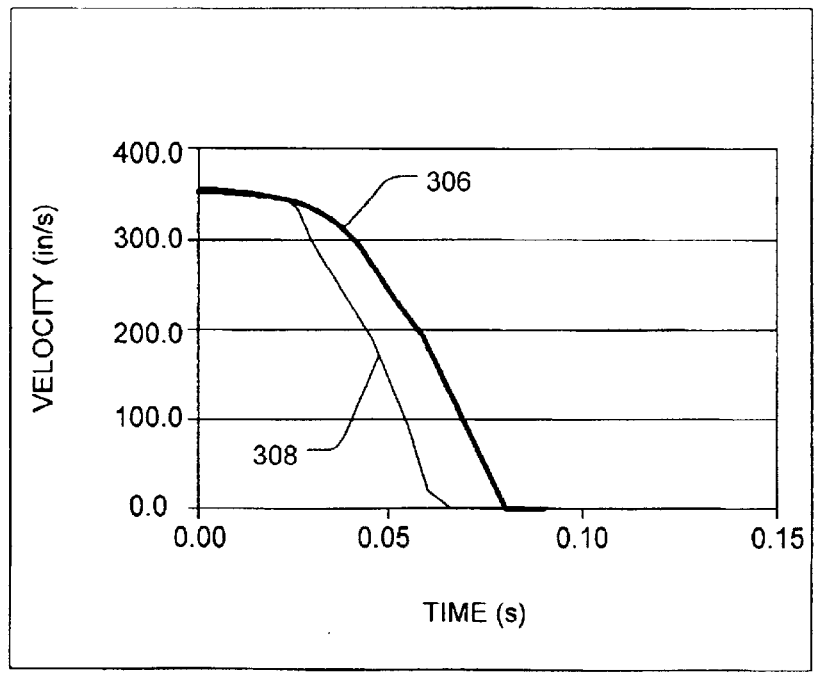
FIG. 33 is a graphical comparison of velocity calculated by a method according to the present invention and another finite element method for the collision of FIG. 30.
Figure 34A:
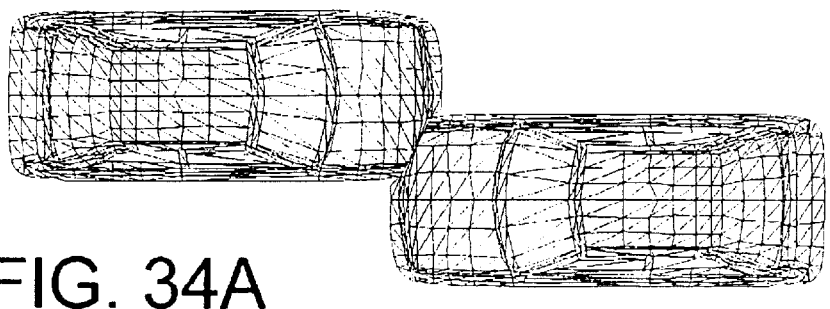
FIG. 34A is a top view of a two-car collision simulated according to the present invention, at 32 milliseconds after impact.
Figure 34B:
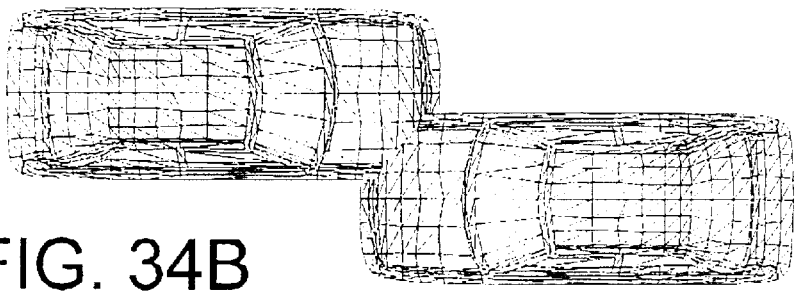
FIG. 34B is a top view of the two-car collision of FIG. 34A, at 64 milliseconds after impact.
Figure 34C:
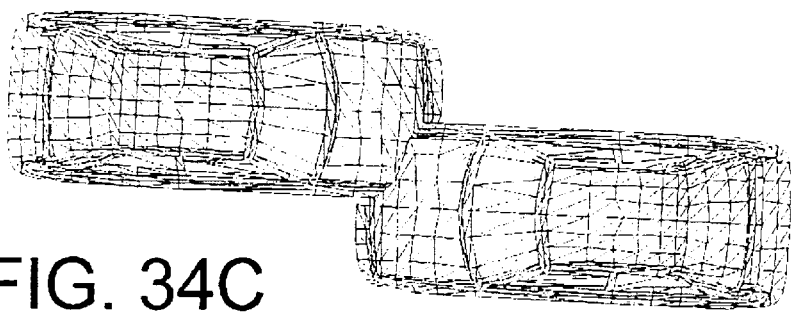
FIG. 34C is a top view of the two-car collision of FIG. 34A, at 88 milliseconds after impact.
Figure 34D:
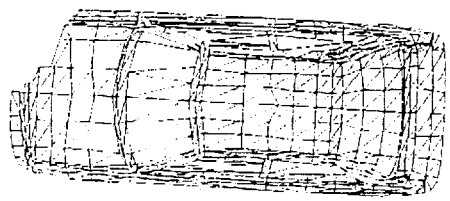
FIG. 34D is a top view of one of the cars of the two-car collision of FIG. 34A, at 88 milliseconds after impact.

In FIG. 30, a vehicle mesh is shown in a precontact orientation relative to an object mesh in the shape of a pole. In FIGS. 31A and 31B, the vehicle mesh is shown from a top view 20 milliseconds after impact and 80 milliseconds after impact, respectively. In FIG. 31C, the vehicle mesh of FIGS. 31A and 31B is shown 100 milliseconds after impact from a front top isometric view. As can be seen, resolution of the mesh in the area of the impact is fine, thereby enabling the vehicle mesh to conform to the shape of the pole. The depicted simulation did not incorporate functional interdependencies between neighbor surfaces such as shear or tension force relationships. as a typical finite element model would. As a result, the simulation shows a narrow channel being carved by the pole in the front of the vehicle mesh. In spite of this approximation, in FIGS. 32 and 33, the simulated acceleration and velocity calculated according to the present invention, at 302 and 306 respectively, is shown to closely conform to acceleration and velocity values calculated by a typical finite element model. at 304 and 308. In another embodiment of the invention, the deformation relationship includes surface stiffness relationships which cause tension and compression forces to be exerted on neighboring nodes of the mesh as the distance between the nodes increases and decreases. A simulation of the collision of FIGS. 31A–31C according to this embodiment would result in incidental damage and widening of the channel carved by the pole. Finally, in FIGS. 34A–34D, two vehicle meshes are shown colliding in a region near the front quarter panel of each vehicle mesh. The collision is shown at 32 milliseconds. 64 milliseconds, and 88 milliseconds after impact in FIGS. 34A–34C, respectively. One of the vehicles of FIG. 34C is shown in isolation in FIG. 34D.

While the invention has been disclosed in its preferred form, the specific embodiments thereof as disclosed and illustrated herein are not to be considered in a limiting sense as numerous variations are possible. The subject matter of the invention is regarded to include all novel and non-obvious combinations and subcombinations of the various elements, features, functions and/or properties disclosed herein. No single feature, function, element or property of the disclosed embodiments is essential. The following claims define certain combinations and subcombinations which are regarded as novel and non-obvious. Other combinations and subcombinations of features, functions, elements and/or properties may be claimed through amendment of the present claims or presentation of new claims in this or a related application. Such claims are also regarded as included within the subject matter of applicant's invention irrespective of whether they are broader, narrower, or equal in scope to the original claims.

We claim:

1. A method of conducting a computerized simulation of a collision between a vehicle and an object, where each of the vehicle and the object include a respective outer surface, the method comprising:
    providing a three dimensional object shell mesh in the form of the outer surface of the object, and a three dimensional vehicle shell mesh in the form of the outer surface of the vehicle, each of the meshes having a respective deformation relationship relating a force required to cause a deformation in a region of the shell mesh;
    moving the shell meshes until a collision is detected; and
    calculating a series of positions of the shell meshes during the collision, each position being based on a prior calculated position, wherein calculating the series of positions includes:
        alternating between (1) the vehicle shell mesh as a master shell mesh and the object shell mesh as a slave shell mesh, and (2) the object shell mesh as a master shell mesh and the vehicle shell mesh as a slave shell mesh;
        detecting penetration of a penetrated region of the master shell mesh by a penetrating region of the slave shell mesh;
        deforming the penetrating region of the slave shell mesh a deformation distance to lie adjacent the master shell mesh, thereby creating a deformed region of the slave shell mesh;
        calculating a deformation collision force acting on the deformed region of the slave shell mesh based on the deformation distance and the deformation relationship for the slave shell mesh;
        applying the deformation collision force to the slave shell mesh; and
        moving the slave shell mesh to a next position based on the deformation collision force.

2. The method of claim 1, wherein the regions of each shell mesh have no independently associated mass.

3. The method of claim 1, wherein each of the shell meshes has no thickness.

4. The method of claim 1, wherein each of the deformation relationships is a stiffness relationship.

5. The method of claim 1, wherein deformation of a node does not exert a shearing effect on adjacent nodes.

6. The method of claim 1, further comprising, after deforming the penetrating region of the slave shell mesh and creating a deformed region of the slave shell mesh, restituting the deformed region of the slave shell mesh.

7. The method of claim 6, wherein each of the shell meshes includes an associated restitution relationship relating a deformation parameter to a restitution distance for a deformed region of the mesh, and wherein the deformed region of the slave shell mesh is restituted based on the restitution relationship.

8. The method of claim 7, wherein the deformation parameter is cumulative deformation distance experienced by the deformed region.

9. The method of claim 7, where the deformation parameter is cumulative deformation force experienced by the deformed region.

10. The method of claim 6, further comprising, restituting the deformed region until a collision due to restitution is detected between the deformed region of the slave shell mesh and a penetrated region of the master shell mesh.

11. The method of claim 10, further comprising, calculating a restitution collision force acting on the deformed region of the slave shell mesh resulting from the restitution collision.

12. The method of claim 11, wherein during the restitution collision, the slave shell mesh penetrates the master shell mesh a restitution penetration distance, and wherein the restitution collision force is calculated based on the restitution penetration distance and the deformation relationship of the slave shell mesh.

13. The method of claim 12, further comprising:
    applying the restitution collision force to the slave shell mesh;
    moving the slave shell mesh to a next position based on the restitution collision force.

14. A method of conducting a computerized simulation of a collision between a first body and a second body, the method comprising:
    providing a first three dimensional mesh in the form of the first body, and a second three dimensional mesh in the form of the second body, each of the meshes being formed of nodes and surface elements, and having a respective deformation relationship relating a fore required to cause a deformation in a region of the mesh;
    moving the metes until a collision is detected; and
    calculating a series of positions of the meshes during the collision, each position being based on a prior calculated position, wherein calculating the series of positions includes:
        alternating between (1) the fist mesh as a master mesh and the second mesh as a slave mesh, and (2) the second mesh as a master mesh and the first mesh as a slave mesh the master mesh having master surface elements and the slave mesh having slave nodes;
        for each of a plurality of slave nodes:
            (1) detecting penetration of a master surface element by the slave node;
            (2) deforming the penetrating slave node a deformation distance to lie adjacent master mesh;
            (3) calculating a local deformation collision force acting on the penetrating slave node based on the deformation distance and the deformation relationship for the slave mesh;

summing the local deformation collision forces for the plurality of penetrating slave nodes, thereby calculating a general collision force;

applying the generalized collision force to the slave met;

moving the slave mesh to a next position based on the generalized collision force.

15. The method of claim 14, wherein the nodes and surface elements of each mesh have no independently associated mass.

16. The method of claim 14, wherein each of the deformation relationships is a stiffness relationship.

17. The method of claim 14, wherein deformation of a node does not exert a shearing effect on adjacent nodes.

18. The method of claim 14, wherein each of the meshes is a shell.

19. The method of claim 18, wherein each shell has no thickness.

20. The method of claim 14, further comprising, after deforming the penetrating slave node, restituting the penetrating slave node.

21. The method of claim 20, wherein each of the meshes includes an associated restitution relationship relating a deformation parameter to a restitution distance for a deformed region of the mesh, and wherein the deformed slave node is restituted based on the restitution relationship.

22. The method of claim 21, wherein the deformation parameter is cumulative deformation distance experienced by the deformed slave node.

23. The method of claim 21, where the deformation parameter is cumulative deformation force experienced by the deformed slave node.

24. The method of claim 21, further comprising, restituting the deformed slave node until a collision due to restitution is detected between the deformed slave node and a penetrated master surface element.

25. The method of claim 24, further comprising, calculating a local restitution collision force acting on the deformed slave node of the slave shell mesh resulting from the restitution collision.

26. The method of claim 25, wherein during the restitution collision, the slave shell mesh penetrates the master shell mesh a restitution penetration distance, and wherein the restitution collision force is calculated based on the restitution penetration distance and the deformation relationship.

27. The method of claim 26, further comprising:

summing the local restitution collision forces from each of the penetrating slave nodes, to calculate a generalized restitution collision force.

28. The method of claim 27, further comprising:

applying the generalized restitution collision force to the slave mesh; and moving the slave mesh to a next position based on the restitution collision force.

29. A method for conducting a computerized simulation of a collision between a vehicle and an object, the method comprising:

defining a vehicle mesh of surface elements and nodes, the vehicle mesh being in the shape of the vehicle;

defining an object mesh of surface elements and nodes, the object mesh being in the shape of the object;

assigning a respective deformation relationship to each of the vehicle and object meshes, each deformation relationship relating a force required to cause a deformation in a region of the associated mesh;

assigning a respective restitution relationship to each of the vehicle and object meshes, each restitution relationship describing the distance a deformed region of the associated mesh will restitute after being deformed;

moving the meshes until a collision is detected; and calculating a series of positions of the meshes during the collision, each position being based on a prior calculated position, wherein calculating the series of positions includes:

over a plurality of timesteps, alternating between (1) the vehicle mesh as a master mesh and the object mesh as a slave mesh, and (2) the object mesh as a master mesh and the vehicle mesh as a slave mesh, the master mesh having master surface elements and the slave mesh having slave nodes;

at each timestep, for each of a plurality slave nodes on the slave mesh:

(1) determining whether the slave node has penetrated a maser surface element and therefore should be deformed, and if so, (a) deforming the slave node a deformation distance to lie adjacent the maser mesh and (b) calculating a local deformation collision force acting on the slave node based on the deformation distance and the deformation relationship of the slave mesh;

(2) determining whether the slave node should be restituted, and if so, restituting the slave node and deter whether a restitution collision has occurred, and if so, calculating a local restitution collision force acting on the slave node;

calculating a generalized collision force based on the local deformation and restitution collision forces acting at each slave node;

applying the generalized collision force to the slave mesh; and moving the slave mesh to a next position based on the generalized collision force.

30. The method of claim 29, Her comprising, after determining whether a restitution collision has occurred, deforming the slave node back a deformation distance to lie adjacent the maser mesh, wherein the restitution collision force is calculated based on the deformation relationship for the slave mesh and the deformation distance.

31. The method of claim 29, further comprising, storing a cumulative deformation distance for each deformed slave node.

32. The method of claim 31, further comprising, before restituting each slave node, calculating a total restitution distance for the slave node as a distance related to the cumulative deformation distance by the restitution relationship, wherein determining whether the slave node should be restituted includes determining whether the node previously has been restituted the total restitution distance.

33. The method of claim 29, wherein the nodes and surface elements of each mesh have no independently associated mass.

34. The method of claim 29, wherein the each mesh is a shell mesh.

35. The method of claim 34, wherein each shell mesh has no thickness.

36. The method of claim 29, wherein each deformation relationship is a stiffness relationship.

37. The method of claim 29, wherein deformation of a node does not exert a shearing effect on adjacent nodes.

* * * * *